(12) United States Patent
Chan et al.

(10) Patent No.: US 12,513,948 B2
(45) Date of Patent: Dec. 30, 2025

(54) FORMING EPITAXIAL STRUCTURES IN FIN FIELD EFFECT TRANSISTORS

(71) Applicant: Taiwan Semiconductor Manufacturing Co., Ltd., Hsin-Chu (TW)

(72) Inventors: Chia-Ling Chan, New Taipei (TW); Derek Chen, Taipei (TW); Liang-Yin Chen, Hsinchu (TW); Chien-I Kuo, Chiayi County (TW)

(73) Assignee: TAIWAN SEMICONDUCTOR MANUFACTURING CO., LTD, Hsinchu (TW)

( * ) Notice: Subject to any disclaimer, the term of this patent is extended or adjusted under 35 U.S.C. 154(b) by 0 days.

(21) Appl. No.: 17/982,216

(22) Filed: Nov. 7, 2022

(65) Prior Publication Data
US 2023/0058699 A1 Feb. 23, 2023

Related U.S. Application Data

(62) Division of application No. 16/725,802, filed on Dec. 23, 2019, now Pat. No. 11,495,674, which is a
(Continued)

(51) Int. Cl.
*H10D 62/00* (2025.01)
*H01L 21/02* (2006.01)
(Continued)

(52) U.S. Cl.
CPC ..... *H10D 62/021* (2025.01); *H01L 21/02532* (2013.01); *H01L 21/0257* (2013.01);
(Continued)

(58) Field of Classification Search
CPC ............ H01L 29/66636; H10D 62/021; H10D 30/024; H10D 30/6211; H10D 84/853;
(Continued)

(56) References Cited

U.S. PATENT DOCUMENTS

| 8,836,016 B2 | 9/2014 | Wu et al. |
| 8,841,701 B2 | 9/2014 | Lin et al. |

(Continued)

FOREIGN PATENT DOCUMENTS

| CM | 101814456 A | * | 8/2010 | ..... H01L 21/823814 |
| CN | 105280699 A | | 1/2016 | |

(Continued)

OTHER PUBLICATIONS

Machine language translation of CN 101814456 A (Year: 2010).*

*Primary Examiner* — Erik Kielin
(74) *Attorney, Agent, or Firm* — HAYNES AND BOONE, LLP

(57) ABSTRACT

A method of forming source/drain features in a FinFET device includes providing a fin formed over a substrate and a gate structure formed over a fin, forming a recess in the fin adjacent to the gate structure, forming a first epitaxial layer in the recess, forming a second epitaxial layer over the first epitaxial layer, and forming a third epitaxial layer over the second epitaxial layer. The second epitaxial layer may be doped with a first element, while one or both of the first and the third epitaxial layer includes a second element different from the first element. One or both of the first and the third epitaxial layer may be formed by a plasma deposition process.

20 Claims, 18 Drawing Sheets

Related U.S. Application Data division of application No. 15/907,427, filed on Feb. 28, 2018, now Pat. No. 10,522,656.

(51) Int. Cl.
*H01L 21/225* (2006.01)
*H01L 21/324* (2006.01)
*H10D 30/01* (2025.01)
*H10D 30/62* (2025.01)
*H10D 62/13* (2025.01)
*H10D 62/834* (2025.01)

(52) U.S. Cl.
CPC ...... *H01L 21/0262* (2013.01); *H01L 21/2252* (2013.01); *H01L 21/324* (2013.01); *H10D 30/024* (2025.01); *H10D 30/6211* (2025.01); *H10D 62/151* (2025.01); *H10D 62/834* (2025.01)

(58) Field of Classification Search
CPC ............... H10D 84/0193; H10D 30/62; H10D 64/251–259
See application file for complete search history.

(56) References Cited

U.S. PATENT DOCUMENTS

| | | |
|---|---|---|
| 8,847,293 B2 | 9/2014 | Lee et al. |
| 8,853,025 B2 | 10/2014 | Zhang et al. |
| 8,962,400 B2 | 2/2015 | Tsai et al. |
| 9,093,514 B2 | 7/2015 | Tsai et al. |
| 9,236,267 B2 | 1/2016 | De et al. |
| 9,245,805 B2 | 1/2016 | Yeh et al. |
| 9,520,482 B1 | 12/2016 | Chang et al. |
| 9,576,814 B2 | 2/2017 | Wu et al. |
| 2006/0148220 A1 | 7/2006 | Lindert et al. |
| 2006/0264051 A1 | 11/2006 | Thibaut |
| 2007/0190731 A1 | 8/2007 | Chen et al. |
| 2007/0278523 A1 | 12/2007 | Lin |
| 2012/0135575 A1 | 5/2012 | Wong et al. |
| 2012/0187486 A1 | 7/2012 | Goto |
| 2013/0122676 A1 | 5/2013 | Jeng |
| 2013/0171790 A1* | 7/2013 | Wang .................. H10D 30/023 438/283 |
| 2014/0264575 A1 | 9/2014 | Tsai |
| 2015/0132909 A1 | 5/2015 | Choi et al. |
| 2015/0214345 A1* | 7/2015 | Wan .................. H01L 29/66242 257/104 |
| 2016/0049511 A1* | 2/2016 | Kim .................. H01L 29/785 257/401 |
| 2016/0087104 A1* | 3/2016 | Lee .................. H01L 29/66795 257/192 |
| 2017/0179120 A1 | 6/2017 | Cheng |
| 2017/0194321 A1 | 7/2017 | Yeong |
| 2017/0309624 A1 | 10/2017 | Cheng |
| 2017/0373151 A1 | 12/2017 | Sasaki et al. |
| 2018/0019339 A1 | 1/2018 | Colinge |
| 2018/0138269 A1* | 5/2018 | Kim .................. H01L 29/161 |
| 2018/0175195 A1 | 6/2018 | Huang |
| 2018/0190772 A1 | 7/2018 | Min et al. |
| 2020/0020774 A1 | 1/2020 | Lee et al. |

FOREIGN PATENT DOCUMENTS

| | | |
|---|---|---|
| TW | 201605050 A | 2/2016 |
| TW | 201731110 A | 9/2017 |

* cited by examiner

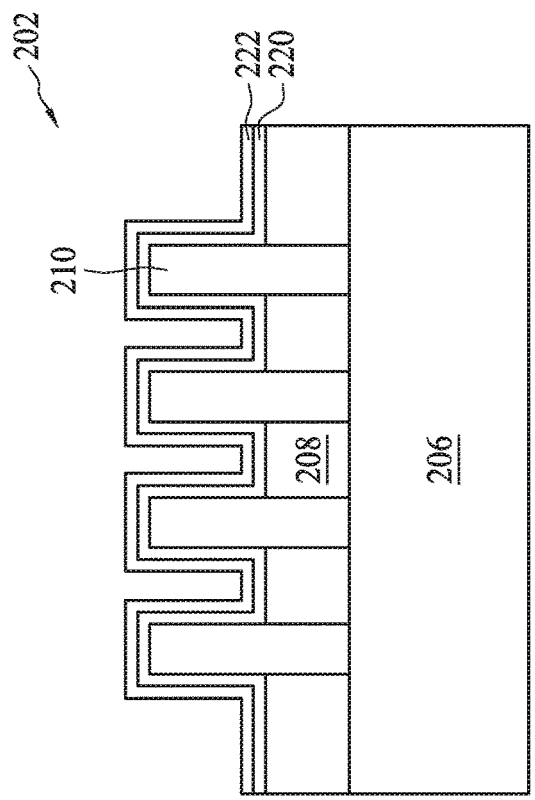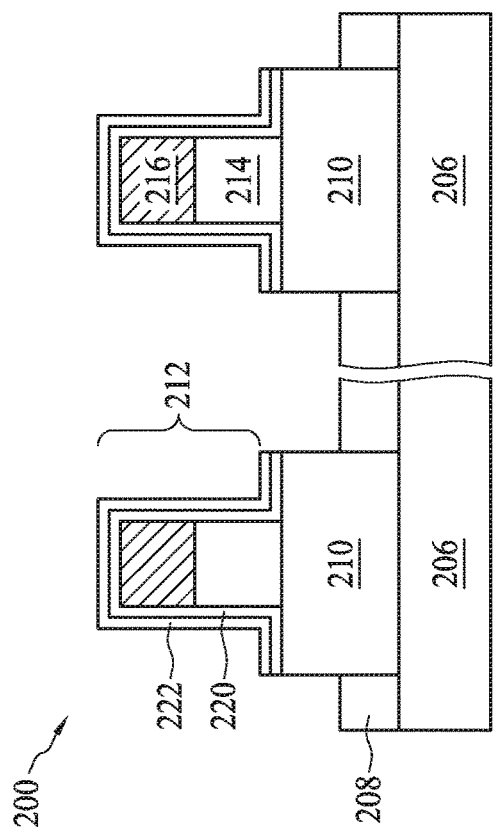
FIG. 4A
FIG. 4B

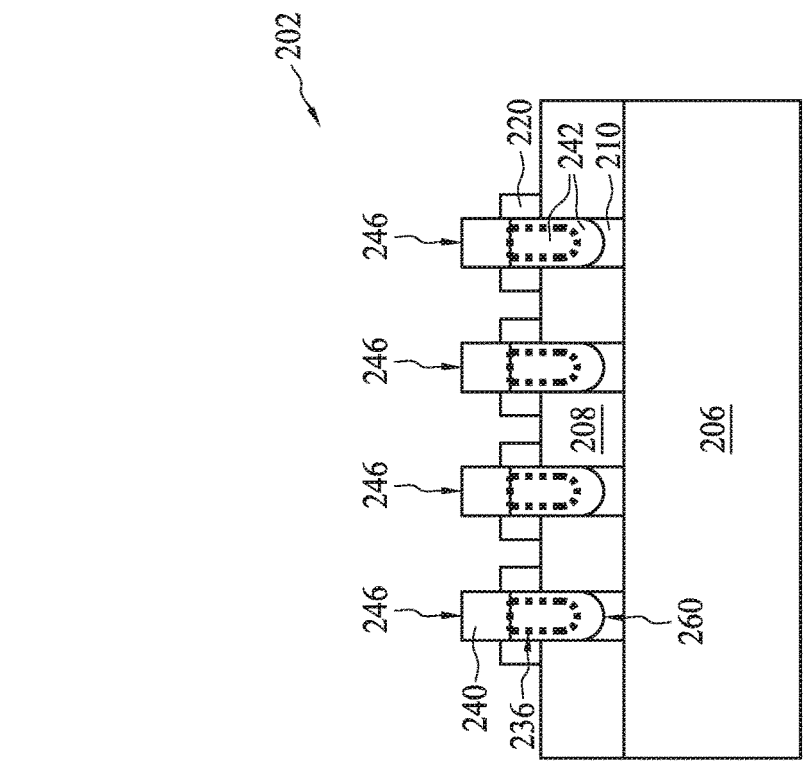
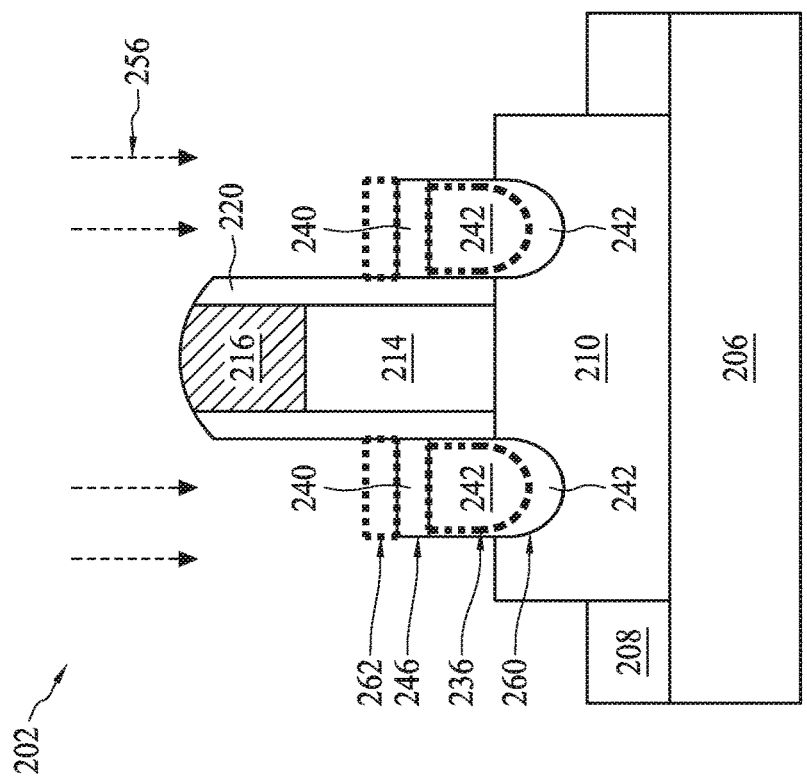
FIG. 13A
FIG. 13B

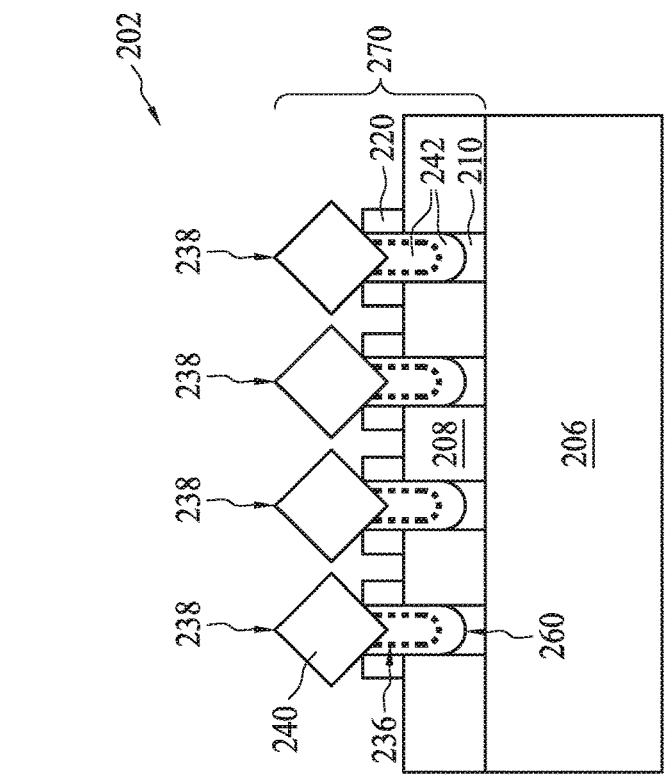
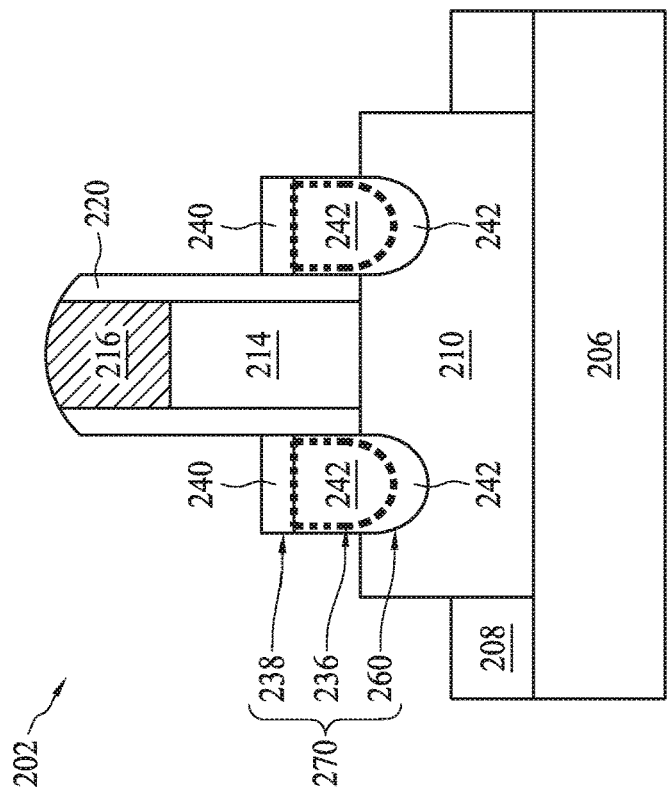
FIG. 14A
FIG. 14B

FORMING EPITAXIAL STRUCTURES IN FIN FIELD EFFECT TRANSISTORS

PRIORITY DATA

This is a divisional application of U.S. patent application Ser. No. 16/725,802 filed Dec. 23, 2019, which is a divisional application of U.S. patent application Ser. No. 15/907,427 filed Feb. 28, 2018, now U.S. Pat. No. 10,522,656, each of which is herein incorporated by reference in its entirety.

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs. For example, while three-dimensional fin-like field effect transistors (FinFET) are desirable for many of today's IC applications, their decreased feature sizes also pose challenges in device fabrication. In one example, shortened channel lengths may lead to lowered barrier for diffusion of active dopant species out of source/drain features, which may compromise device performance. As such, improvements in this area are needed.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3A, 4A, 5A, 6A, 7A, 8A, 9A, 10A, 11A, 12A, 13A, 14A, and 15A are fragmentary cross-sectional views of the exemplary FinFET device along line AA' of FIG. 2 at different steps of an exemplary method of fabrication according to various aspects of the present disclosure.

FIGS. 3B, 4B, 5B, 6B, 7B, 8B, 9B, 10B, 11B, 12B, 13B, 14B, and 15B are fragmentary cross-sectional views of the exemplary FinFET device along line BB' of FIG. 2 at different steps of an exemplary method of fabrication corresponding to FIGS. 3A, 4A, 5A, 6A, 7A, 8A, 9A, 10A, 11A, 12A, 13A, 14A, and 15A, respectively, and according to various aspects of the present disclosure.

DETAILED DESCRIPTION

Figure 1A:
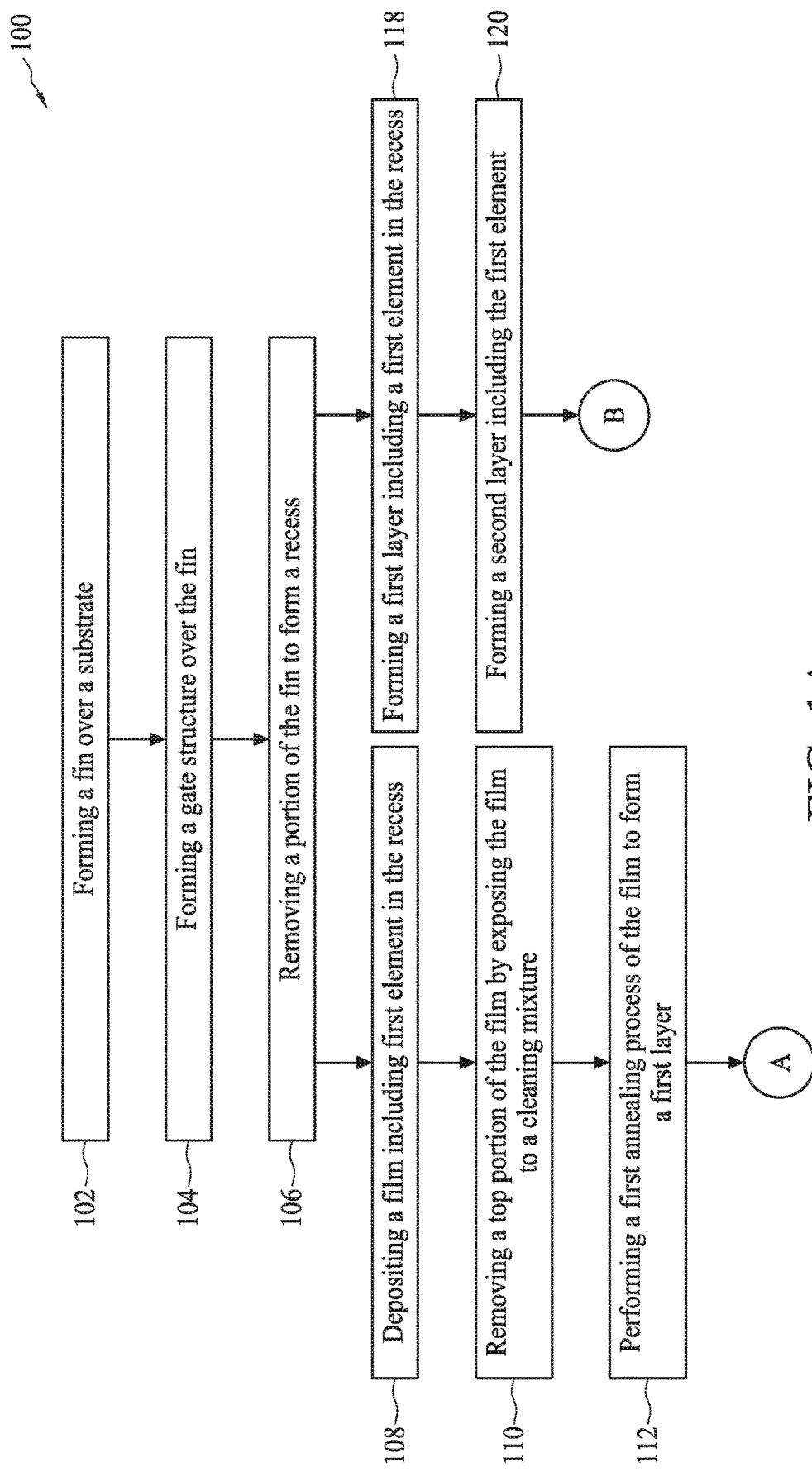
FIGS. 1A and 1B illustrate a flowchart of an exemplary method for fabricating a fin field effect transistor (FinFET) device according to various aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within +/−10% of the number described, unless otherwise specified. For example, the term "about 5 nm" encompasses the dimension range from 4.5 nm to 5.5 nm.

The present disclosure is generally related to methods for semiconductor device fabrication, and more particularly to methods of forming epitaxial source/drain features in fin-like field effect transistor (FinFETs) devices. The FinFET devices may be, for example, complementary metal-oxide-semiconductor (CMOS) devices comprising a p-type metal-oxide-semiconductor (PMOS) FinFET device and an n-type metal-oxide-semiconductor (NMOS) FinFET device. Though the method provided herein may also be applicable in making planar transistor devices, the following disclosure will continue with a FinFET example for illustrative purposes. While FinFETs have enabled devices to be made with reduced feature sizes, many challenges in improving device performance are also present. For example, shortened channel lengths may lower barrier to diffusion and outgassing of active dopant species out of the source/drain features, leading to increased resistance and/or other short-channel effects (SCEs) such as drain-induced barrier lowering (DIBL). Accordingly, the present disclosure provides methods of controlling diffusion of active dopant species in epitaxial source/drain features in FinFET devices.

Figure 1B:
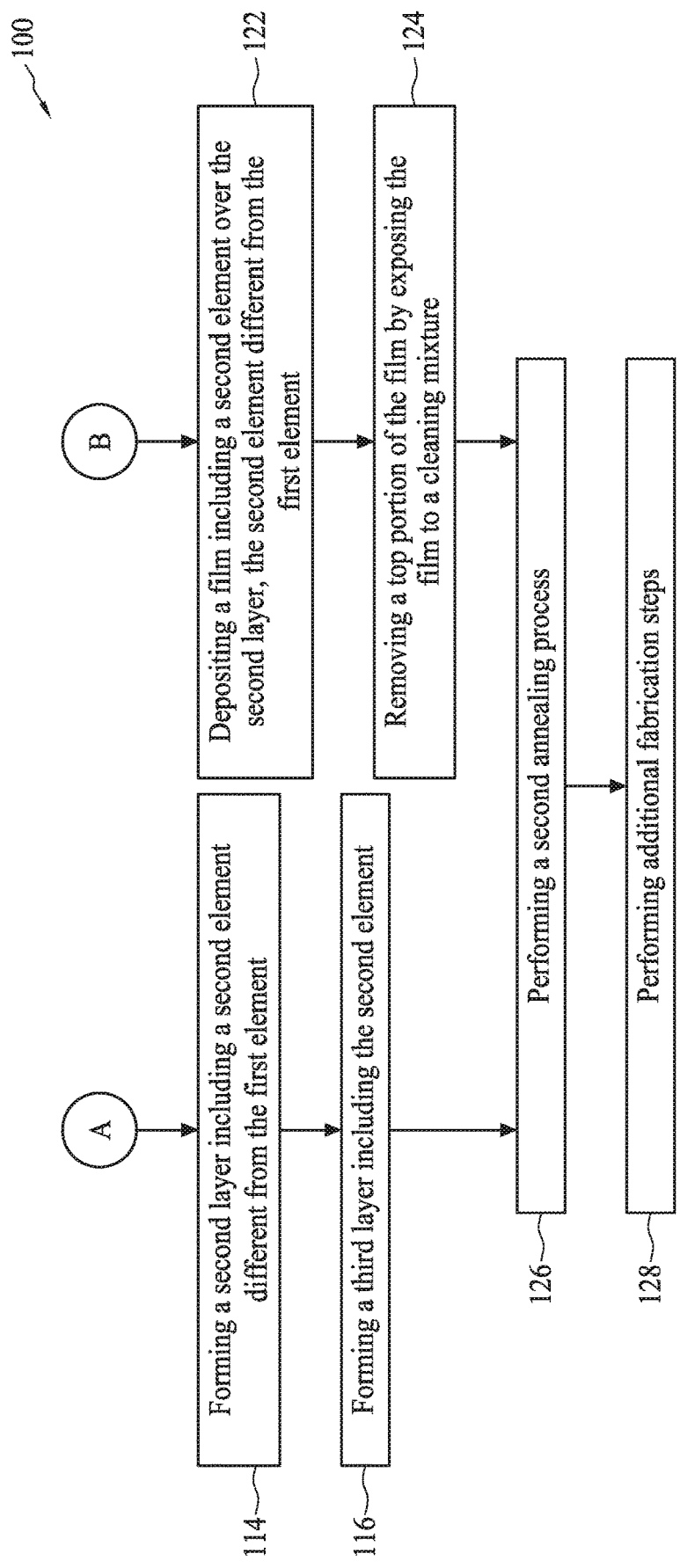

FIGS. 1A and 1B illustrate a flowchart of method 100 for fabricating a FinFET device according to some aspects of the present disclosure. It is understood, however, that the application should not be limited to a particular type of device. Additional steps can be provided before, during, and after the processing methods provided herein, and some of the steps described can be replaced, eliminated, or moved around for additional embodiments of the present disclosure.

Processing steps of method 100 as illustrated in FIGS. 1A-1B are described with respect to cross-sectional views of an exemplary FinFET device 200 depicted in FIGS. 2-17B.

Figure 2:
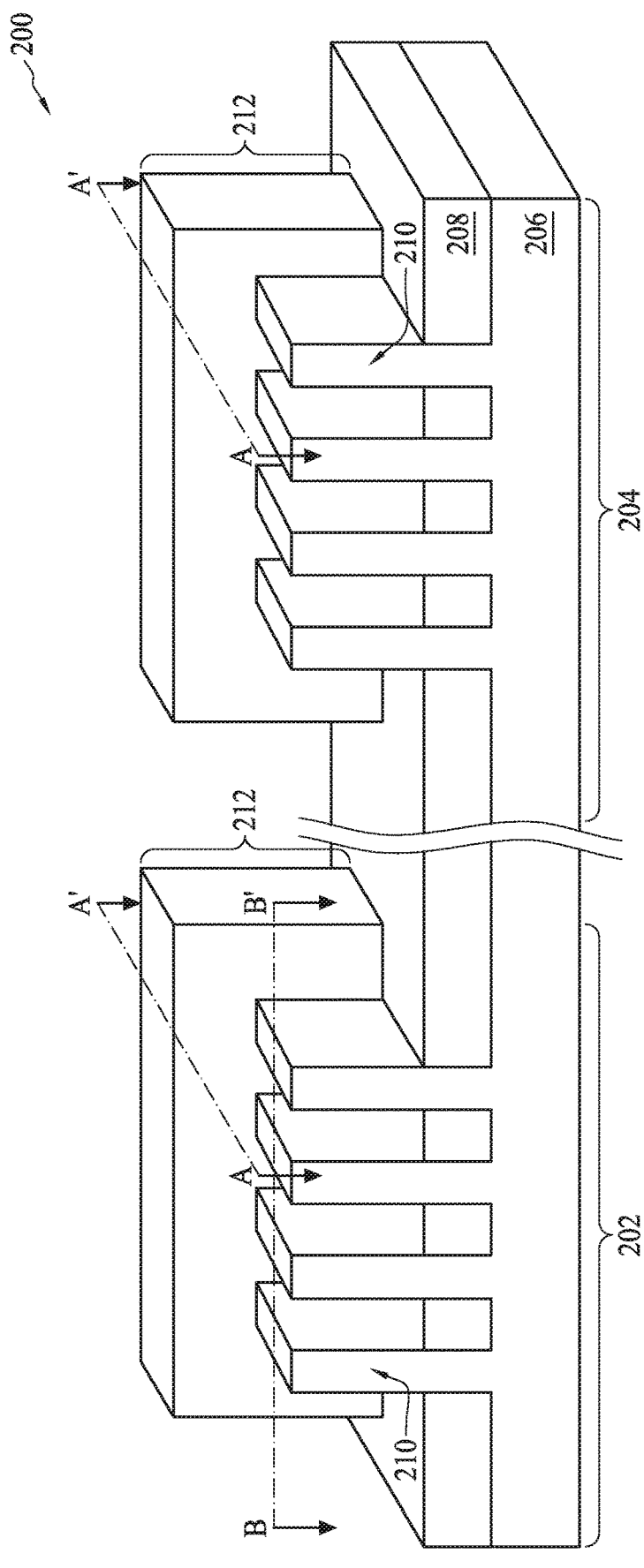
FIG. 2 is a three-dimensional perspective view of an exemplary FinFET device according to various aspects of the present disclosure.
Figure 16B:
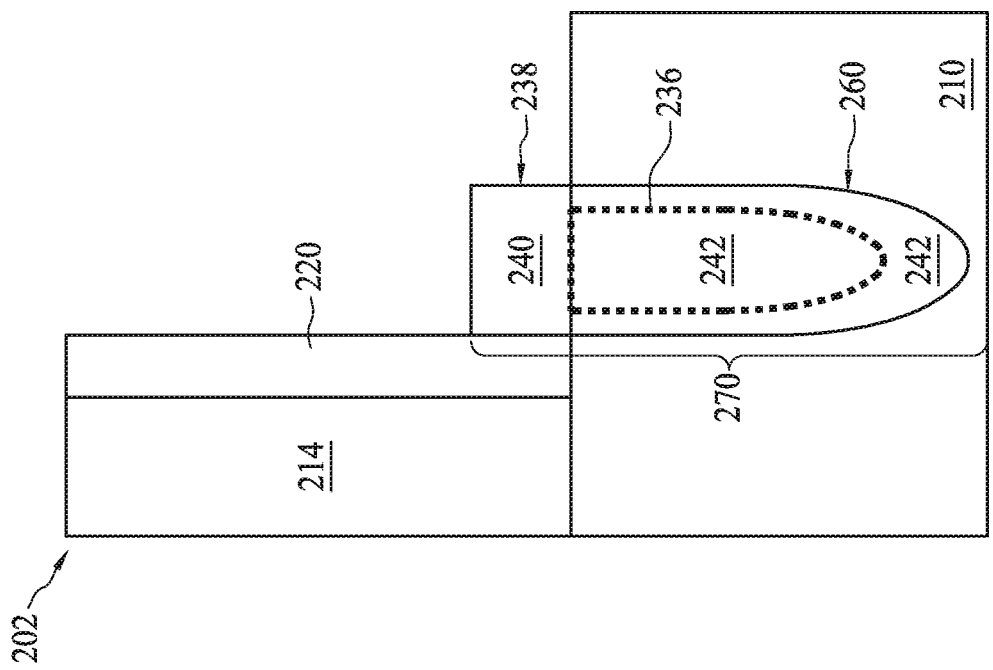
FIGS. 16A, 16B, 17A, and 17B are fragmentary cross-sectional views of the exemplary FinFET device along line AA' of FIG. 2 according to various aspects of the present disclosure.
Figure 16A:
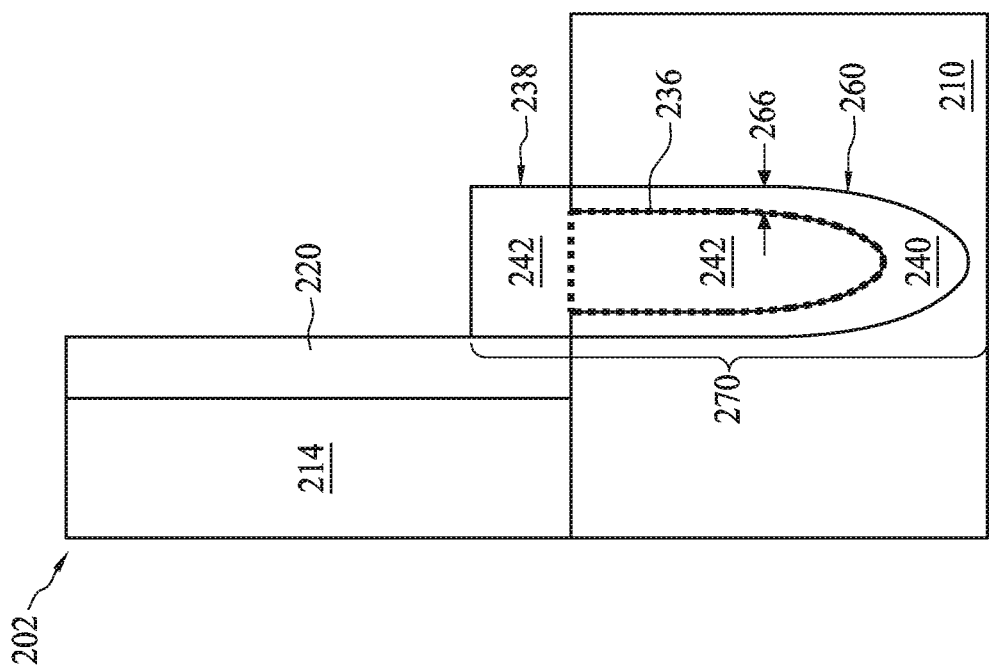
Figure 17A:
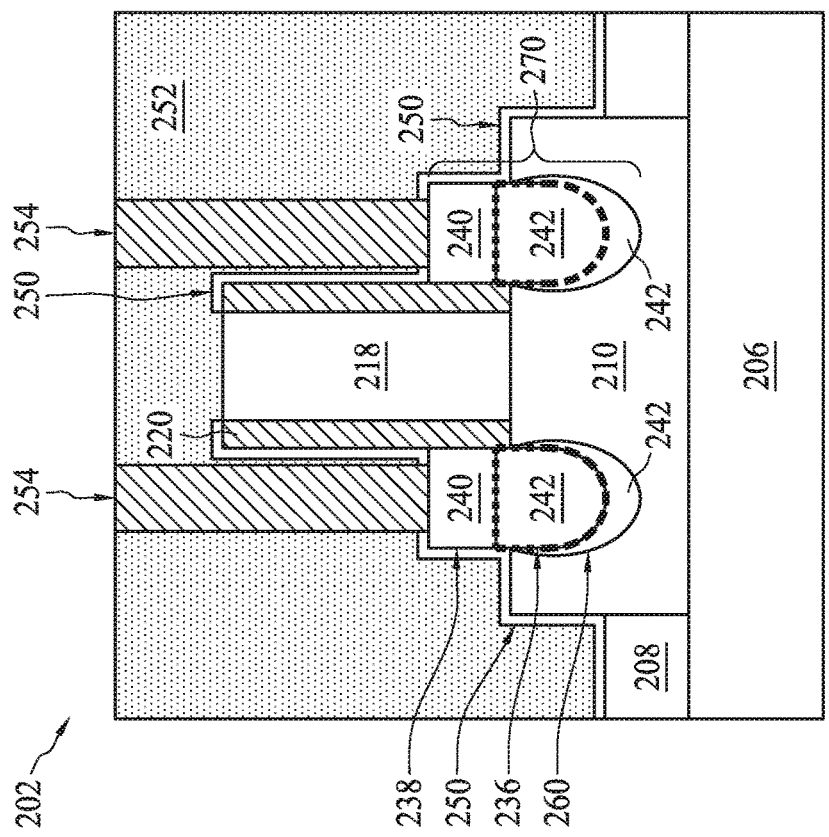
Figure 17B:
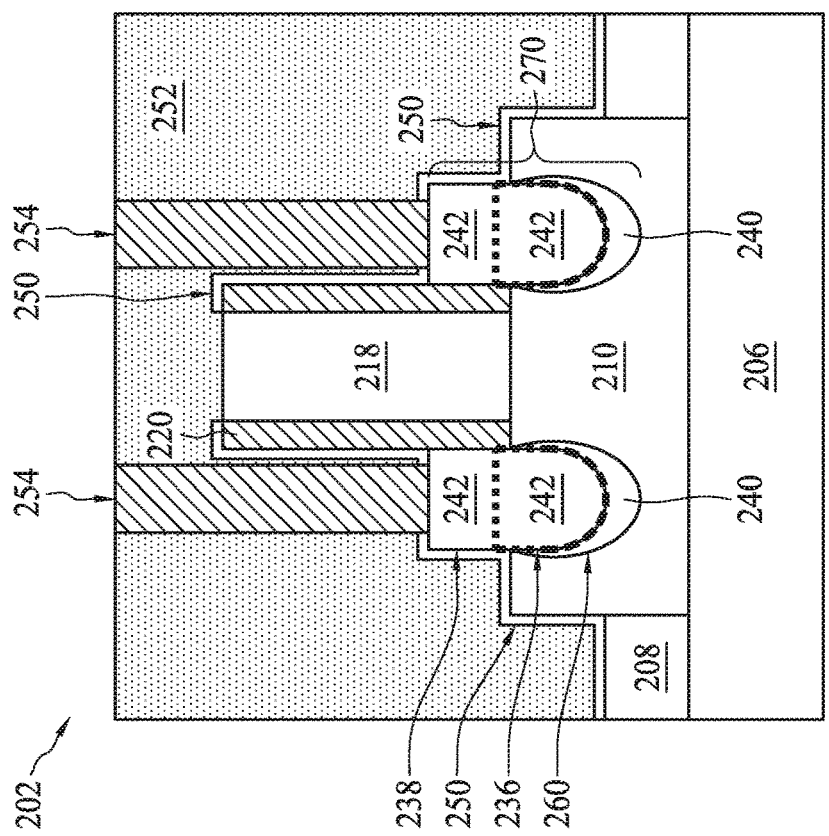

FIG. 2 illustrates a portion of the exemplary FinFET device 200 in a three-dimensional, perspective view. FIGS. 3A, 4A, 5A, 6A, 7A, 8A, 9A, 10A, 11A, 12A, 13A, 14A, and 15A are fragmentary cross-sectional views of the FinFET device 200 taken along direction AA' of FIG. 2 through subsequent processing steps of method 100. Particularly, FIGS. 8A, 9A, 13A, and 14A depict region 202 of the FinFET device 200 in detail. FIGS. 3B, 4B, 5B, 6B, 7B, 8B, 9B, 10B, 11B, 12B, 13B, 14B, and 15B are fragmentary cross-sectional views of the FinFET device 200 taken along direction BB' of FIG. 2 through subsequent processing steps of method 100 corresponding to FIGS. 3A, 4A, 5A, 6A, 7A, 8A, 9A, 10A, 11A, 12A, 13A, 14A, and 15A, respectively. FIGS. 16A and 16B illustrate portions of the FinFET device 200 corresponding to FIGS. 10A and 14A, respectively. FIGS. 17A and 17B are fragmentary cross-sectional views of the FinFET device 200 corresponding to FIGS. 10A and 14A, respectively, following additional fabrication steps of the method 100.

Figure 3A:
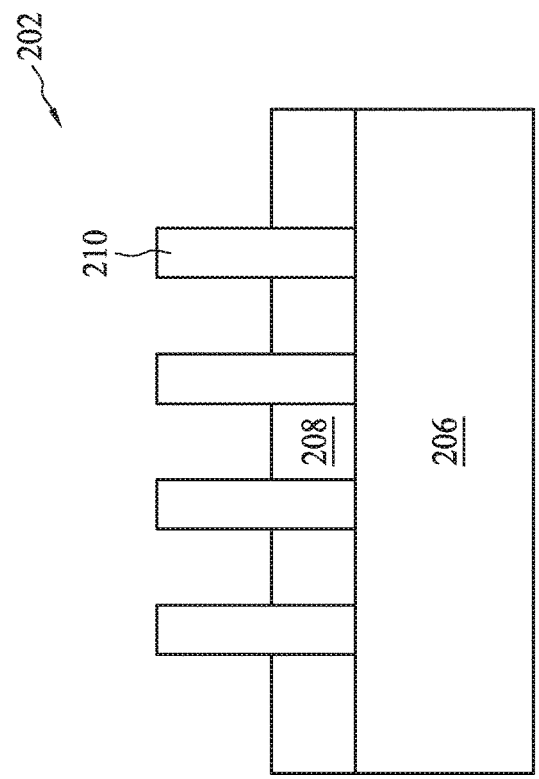
Figure 3B:
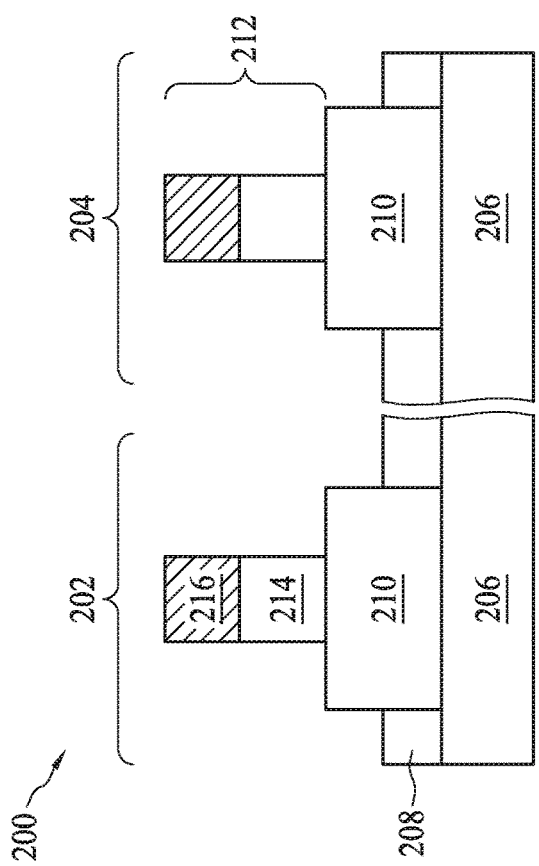

At operation 102 and referring to FIGS. 2, 3A, and 3B, the method 100 (FIG. 1A) forms substantially parallel fins 210 over a substrate 206. In the depicted embodiment, two separate regions, a first region 202 and a second region 204, are provided on the substrate 206, though they may or may not be immediately adjacent to each other as shown in FIG. 2. The first region 202 may provide NMOS devices and is thus referred to as an NMOS region, and the second region 204 may provide PMOS devices and is thus referred to as a PMOS region. As shown in FIG. 3A (and the subsequent views taken along line AA' of FIG. 2), the first region 202 and the second region 204 are illustrated side-by-side for comparison purposes. The fins 210 in both the first region 202 and the second region 204 are separated by isolation regions 208 formed over the substrate 206. Each region 202 and 204 may include any number of fins 210, although four parallel fins are shown in each region in FIG. 2. Further, regions 202 and 204 may include different numbers of fins 210 in various embodiments.

In many embodiments, the substrate 206 is a semiconductor substrate (e.g., a semiconductor wafer). In some embodiments, the substrate 206 includes silicon. Alternatively, the substrate 206 includes other elementary semiconductors such as germanium; or a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The substrate 206 may include a silicon on insulator (SOI) substrate, be strained/stressed for performance enhancement, include epitaxial regions, include isolation regions, include doped regions, include one or more semiconductor devices (e.g., planar transistors or multi-gate transistors such as FinFETs) or portions thereof, include conductive and/or non-conductive layers, and/or include other suitable features and layers.

In some embodiments, the isolation features 208 include, for example, silicon oxide, silicon nitride, silicon oxynitride, silicon carbide, other suitable dielectric materials, or combinations thereof. The isolation features 208 may include different structures such as shallow trench isolation (STI) structures, deep trench isolation (DTI) structures, and/or local oxidation of silicon (LOCOS) structures.

The fins 210 may be formed by any suitable process. In some embodiments, forming the fins 210 also leads to the formation of the isolation features 208. In an exemplary embodiment, the process can include the following steps: one or more processes for patterning a hard mask layer (not shown) over the substrate 206, a process (e.g., a dry etching and/or wet etching process) for etching trenches in the substrate 206 not covered by the patterned hard mask layer, and a process (e.g., a chemical vapor deposition process and/or a spin-on glass process) to fill in the trenches with one or more insulating materials to form the isolation features 208. The hard mask layer may be silicon oxide, silicon nitride, silicon carbide, silicon oxycarbide, silicon oxynitride, other suitable materials, or combinations thereof and may be formed by any suitable method, such as thermal oxidation, chemical vapor deposition (CVD), physical vapor deposition (PVD), atomic-layer deposition (ALD), plating, and/or other suitable methods. The hard mark layer (not shown) may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over the substrate 206 and patterned using a photolithography process. Spacers are formed alongside the patterned sacrificial layer using a self-aligned process. The sacrificial layer is then removed, and the remaining spacers, or mandrels, become the patterned hard mask layer.

The trenches may be partially filled, such that the substrate 206 remaining between the trenches forms the fins 210. Alternatively, forming the fins 210 may include completely filling the trenches with the insulating materials, planarizing a top surface of the filled trenches to remove any excessive insulating material using, for example, a polishing process such as chemical mechanical polishing/planarization (CMP), and selectively growing one or more layers of epitaxial semiconductor materials over the exposed substrate 206, thereby forming the fins 210 with isolation features 208 disposed between the fins 210. The epitaxial semiconductor material can be, for example, silicon, germanium, silicon germanium, other suitable materials, or combinations thereof. In some embodiments, the filled trenches may have a multi-layer structure such as a thermal oxide liner layer filled with silicon nitride or silicon oxide. Accordingly, the fins 210 formed by embodiments provided herein may comprise the same material as the substrate 206 or, alternatively, they may comprise one or more layers of epitaxially grown semiconductor materials over the substrate 206. In the depicted embodiments, the fins 210 comprise the same material as the substrate 206.

At operation 104 and referring to FIG. 3A, the method 100 (FIG. 1A) forms a gate structure 212 over the fins 210. In the depicted embodiment, the gate structure 212 is a dummy gate structure, portions of which are subjected to a high-k metal gate (HK MG) replacement process after high thermal budget processes are performed. The dummy gate structure 212 may include a dummy gate electrode 214 (e.g., comprising polysilicon), and a hard mask layer 216 over the dummy gate electrode 214. In various embodiments, the dummy gate structure 212 may include additional layers such as an interfacial layer, a gate dielectric layer, capping layers, diffusion/barrier layers, conductive layers, other suitable layers, and/or combinations thereof. The dummy gate structure 212 may be formed by a series of deposition and etching processes. During the subsequent HK MG process, the dummy gate electrode 214 may be replaced with a plurality of metal layers to form a conductive electrode, while the dummy gate dielectric layer may be replaced with a high-k gate dielectric layer.

In some embodiments, the hard mask layer 216 is formed over the dummy gate electrode 214 by a suitable process to accommodate various fabrication processes during the implementation of the method 100. The hard mask layer 216 may be a single layer or may comprise multiple layers, each of which may be any suitable material such as, for example, silicon oxide, silicon nitride, titanium nitride, silicon oxynitride, silicon carbide, silicon oxycarbide, or other suitable material.

Referring to FIGS. 4A and 4B, layers of spacer materials 220 and 222 may be formed over the dummy gate structure 212 and the fins 210. The layer 220 may form offset spacers along sidewalls of the dummy gate structure 212, while the layer 222 may form main spacers adjacent to the offset spacers. The spacer materials 220 and 222 may be similar or different and may each include a dielectric material such as silicon oxide, silicon nitride, silicon oxynitride, silicon carbide, spin-on glass (SOG), a low-k dielectric material, tetraethylorthosilicate (TEOS), plasma-enhanced oxide (PE-oxide), high-aspect-ratio-process (HARP) formed oxide, other dielectric material, or combinations thereof. In some embodiments, each of the spacer materials 220 and 222 may comprise multiple layers of material. The spacer materials 220 and 222 may be formed by any suitable deposition process such as CVD, PVD, ALD, and/or other suitable processes.

Figure 5B:
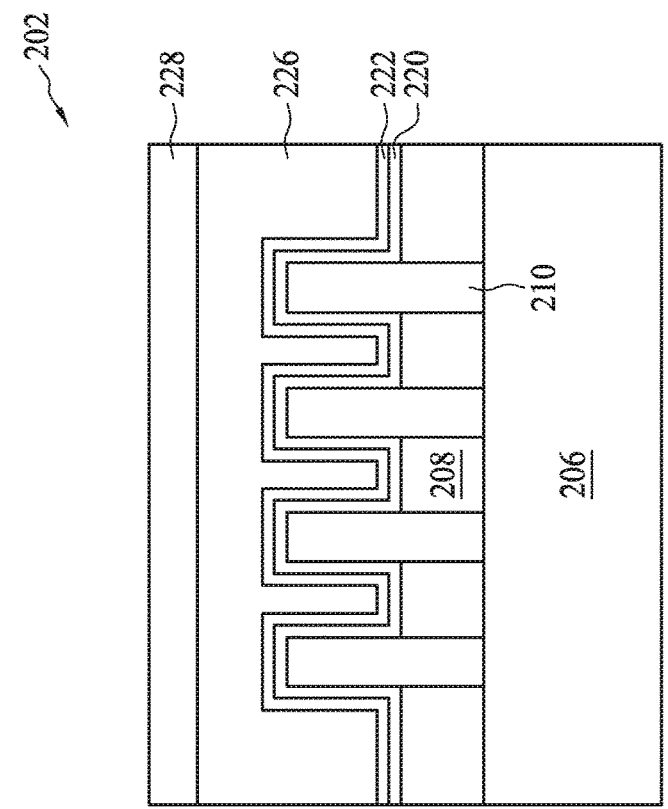
Figure 5A:
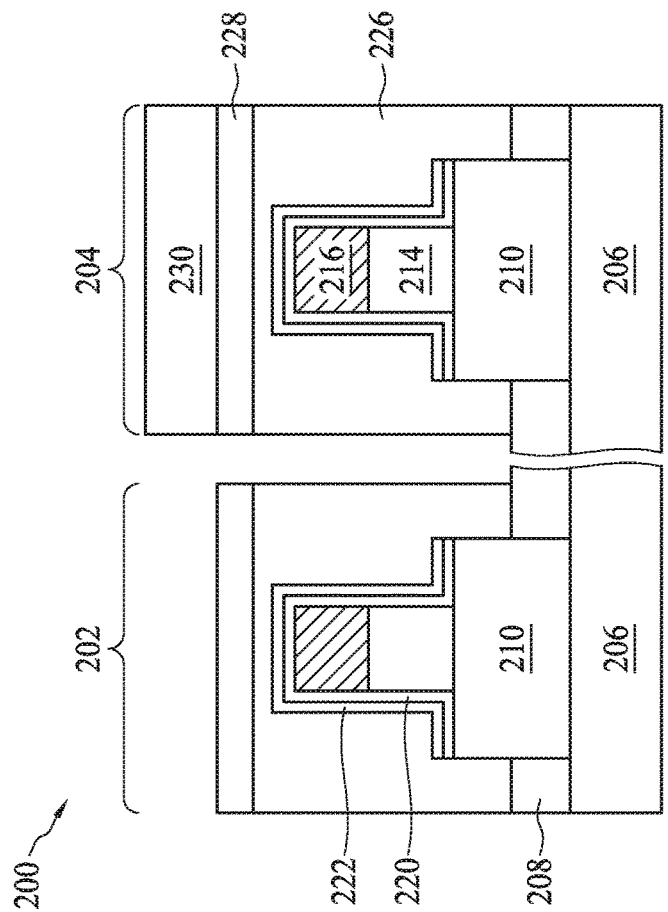

At operation 106, the method 100 (FIG. 1A) removes portions of the fin 210 in the NMOS region 202 (or alternatively, in the PMOS region 204). Referring to FIGS. 5A and 5B, removing portions of the fin 210 in the NMOS region 202 (or the PMOS region 204) includes a series of deposition and patterning processes, such as forming a bottom layer 226 over the fins 210 (and the spacer material layer 222), forming a middle layer 228 over the bottom layer 226, and forming a photoresist layer 230 over the middle layer 228. The bottom layer 226 may be a bottom anti-reflective coating (BARC) layer, and the middle layer 228 may comprise a material different form the bottom layer 226 and may include a dielectric material such as silicon oxide, silicon nitride, titanium nitride, silicon oxynitride, silicon carbide, silicon oxycarbide, and/or other suitable material. The photoresist layer 230 may include any suitable photosensitive material, and may be a positive-tone photoresist material (i.e., exposed regions are removed by a subsequent developing process) or a negative-tone photoresist material (i.e., unexposed regions are removed by a subsequent developing process).

In the depicted embodiment (FIG. 5A), the photoresist layer 230 is patterned using any suitable lithography process to expose the NMOS region 202 for subsequent etching processes. Then, the middle layer 228, the bottom layer 226, and the spacer material layers 220 and 222 may be sequentially etched (FIG. 6A). The etching process may be a dry etching process, a wet etching process, or a combination thereof. In some embodiments, a wet etching process implements an etching solution including potassium hydroxide (KOH), ammonium hydroxide (NH$_4$OH), hydrogen peroxide (H$_2$O$_2$), sulfuric acid (H$_2$SO$_4$), tetramethylammonium hydroxide (TMAH), other suitable wet etching solution, or combinations thereof. In some embodiments, a dry etching process employs an etchant gas that includes a fluorine-containing etchant gas (e.g., CF$_4$, SF$_6$, CH$_2$F$_2$, CHF$_3$, and/or C$_2$F$_6$), an oxygen-containing gas, a chlorine-containing gas (e.g., Cl$_2$, CHCl$_3$, CCl$_4$, and/or BCl$_3$), a bromine-containing gas (e.g., HBr and/or CHBR$_3$), an iodine-containing gas, helium, other suitable gases and/or plasmas, or combinations thereof. In an exemplary embodiment, the etching process is a dry etching process. In the depicted embodiment, the spacer material layers 220 and 222 are anisotropically etched such that a portion of each of the spacer material layers 220 and 222 remains along sidewalls of the dummy gate structure 212 to form gate spacers.

Figure 6B:
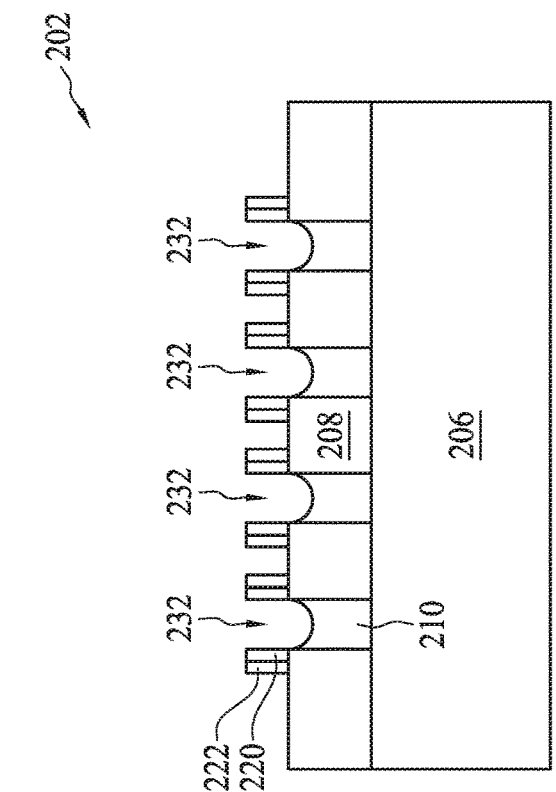
Figure 6A:
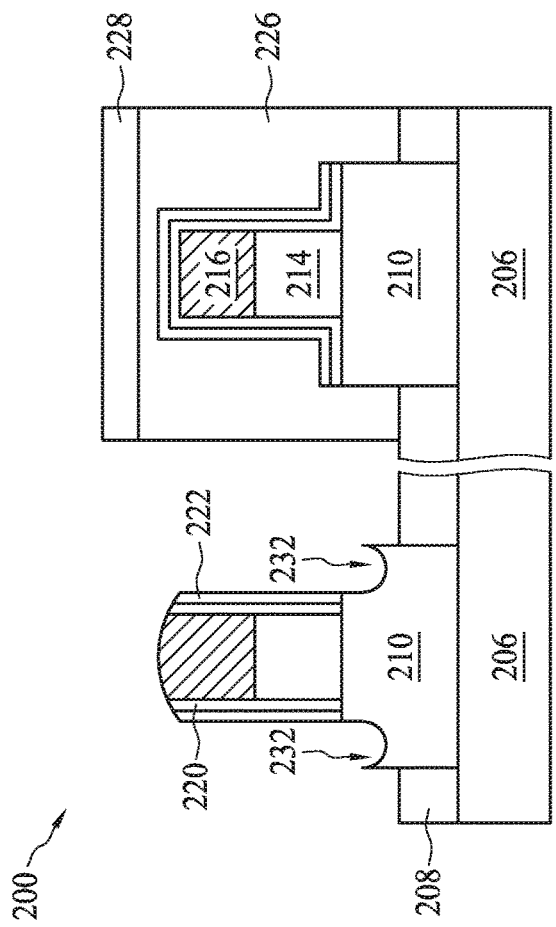
Figure 7A:
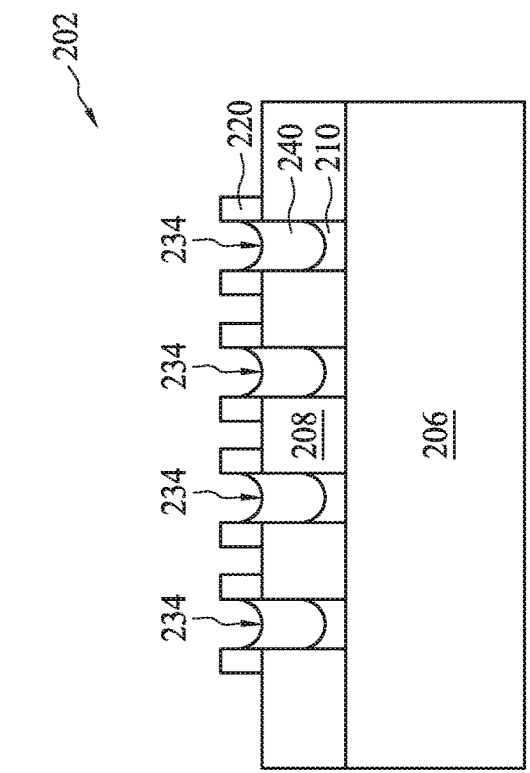
Figure 7B:
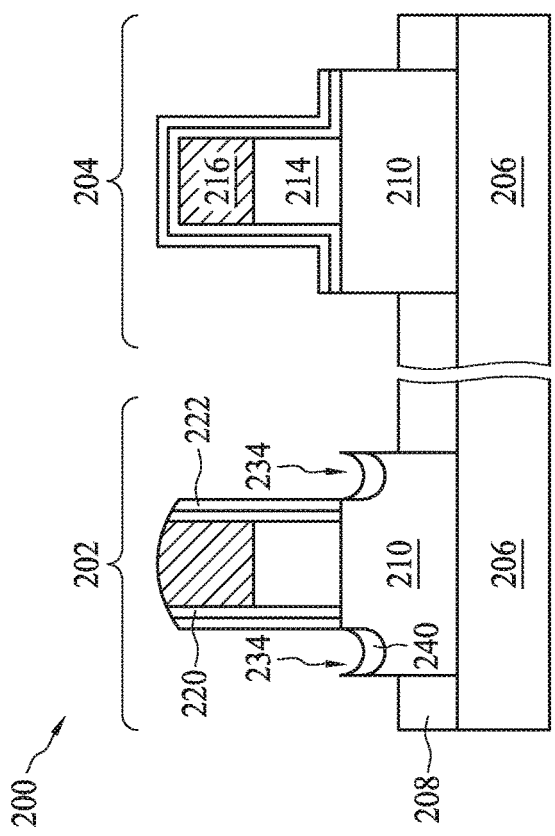

Referring to FIGS. 6A and 6B, portions of the fin 210 in the NMOS region 202 may subsequently be removed to form a recess (i.e., a trench) 232 in the fin 210. In the depicted embodiments, trenches 232 are formed in source/drain regions of the fin 210 via a series of etching processes. Each etching process may be a dry etching process, a wet etching process, or combinations thereof as described in detail above. In an exemplary embodiment, the etching process is a dry etching process and is implemented in multiple cycles to form the trenches 232. Following the series of etching processes, the method 100 may remove the bottom layer 226 and the middle layer 228 from the PMOS region 204.

The method 100 subsequently forms source/drain features in the trenches 232 as described in detail below. At operation 108 and referring to FIGS. 7A and 7B, the method 100 (FIG. 1A) forms a film 234 on a top surface of the trenches 232. In the depicted embodiment, prior to forming the film 234, the top surface of the trenches 232 is subjected to a cleaning/stripping process. The cleaning/stripping process may implement a mixture of sulfuric acid and hydrogen peroxide (sulfuric peroxide mixture, or SPM) at an elevated temperature of about 150 degrees Celsius to about 180 degrees Celsius for about 30 seconds to about 60 seconds.

In many embodiments, the film 234 is uniform in composition and comprises a first element 240. The first element 240 may be any suitable element including arsenic, carbon, phosphorus, boron, germanium, indium, other suitable elements, and/or combinations thereof. In one exemplary embodiment, the first element 240 is arsenic. In another exemplary embodiment, the first element 240 is carbon. The film 234 may be formed by any suitable process including plasma deposition, CVD, PVD, ALD, plasma-enhanced CVD (PE-CVD), and/or other suitable processes. In one example, material in a bottom portion of the film 234 may penetrate or diffuse into a top surface of the underlying fin 210 in the trenches 232. In the depicted embodiment, the film 234 is formed by a plasma deposition process, the details of which are discussed below.

In many embodiments, operation 108 implements a gaseous mixture comprising a precursor gas of the first element 240 and one or more carrier gases over the top surface of the trenches 232. For embodiments in which the first element 240 is arsenic, the precursor gas may be AsH$_3$. The carrier gas may be any suitable gas including hydrogen, helium, argon, xenon, other suitable gas, or combinations thereof. In one exemplary embodiment, the gaseous mixture comprises AsH$_3$, hydrogen, and helium. In another exemplary embodiment, the gaseous mixture comprises AsH$_3$, hydrogen, and argon. In yet another exemplary embodiment, the gaseous mixture comprises AsH$_3$, hydrogen, and xenon. The concentration of AsH$_3$ in the gaseous mixture may be less than about 10%.

The implementation of the gaseous mixture may be influenced by a number of operating parameters including skew bias voltage, power of a radiofrequency (RF) source, dosage or concentration of the precursor gas with respect to the carrier gas(es), flow rate of the gaseous mixture, and duration of deposition. In the depicted embodiment, the bias voltage is about 2 kV, the RF power is from about 500 W to about 1500 W, the dosage of the precursor gas is from about $1\times10^{46}$ to about $4\times10^{21}$, the flow rate is from about 90 scm (standard cubic meter) to about 150 scm or from about 5 mT (milliTorr) to about 100 mTorr, and duration of deposition is less than about 150 ms.

Figure 8B:
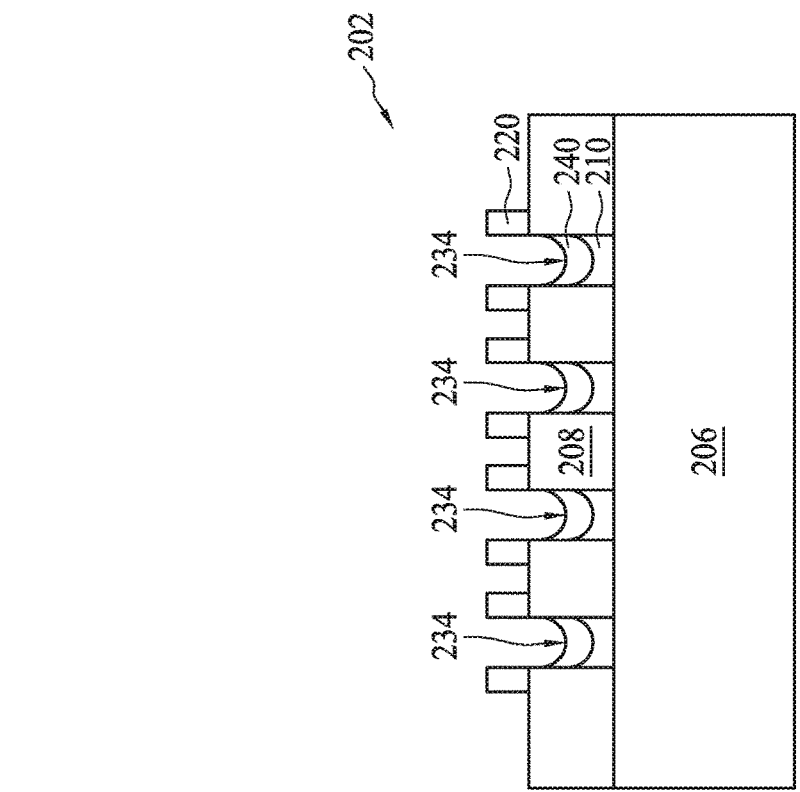
Figure 8A:
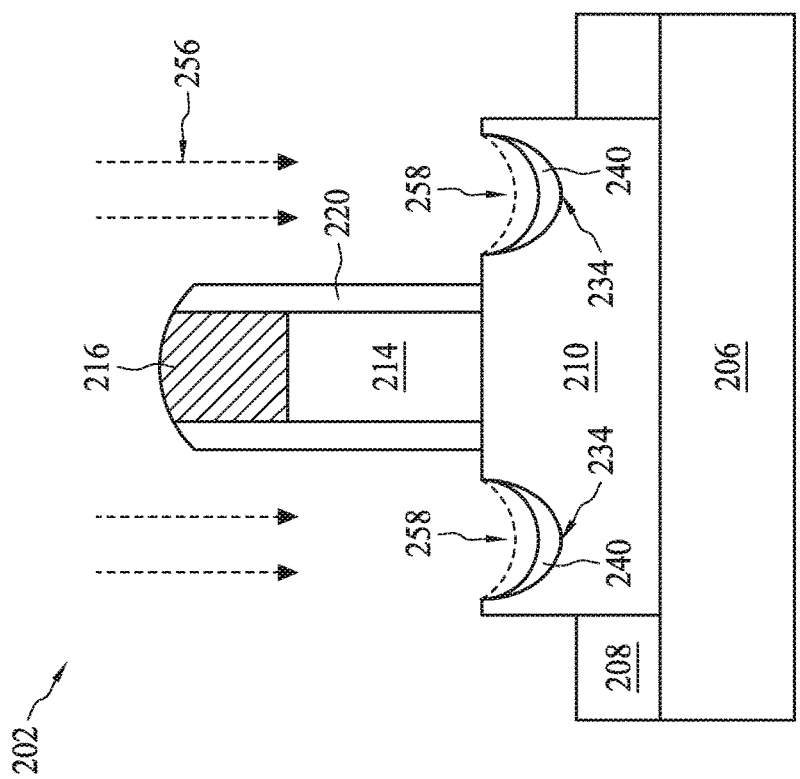
Figure 9B:
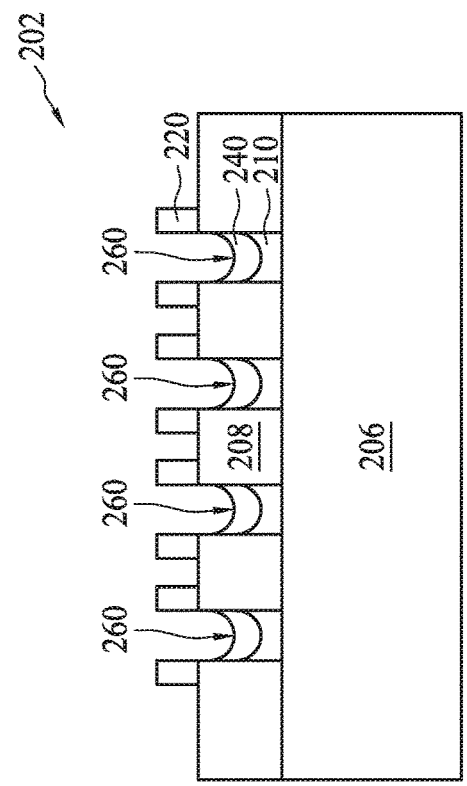
Figure 9A:
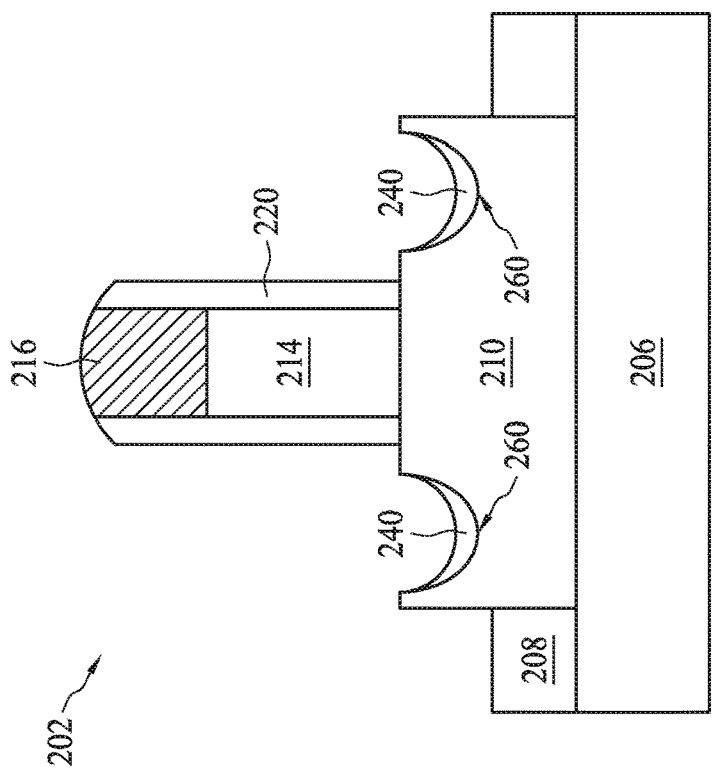

Following operation 108, referring to FIGS. 8A and 8B, the method 100 (FIG. 1A) implements operation 110 during which a top portion 258 of the film 234 is removed by a cleaning process. In the depicted embodiment, operation 110 is implemented by applying a cleaning solvent 256 (e.g., SPM) at an elevated temperature of about 150 degrees Celsius to about 180 degrees Celsius for about 30 seconds to about 120 seconds. In many embodiments, the cleaning process is implemented such that it selectively removes only the top portion 258 of the film 234, leaving behind the bottom portion of the film 234 that has penetrated into the top surface of the trench 232 (i.e., the fin 210). On one hand, if the temperature is higher than about 180 degrees Celsius and/or if the cleaning process is implemented for longer than about 60 seconds, the bottom portion of the film 234 that has penetrated into the top surface of the trench 232 may be removed inadvertently, leaving behind an insufficient amount of the first element 240 to subsequently form a semiconductor layer (e.g., the first layer 260 to be described below). On the other hand, if the temperature is lower than about 150 degrees Celsius and/or if the cleaning process is implemented for shorter than about 30 seconds, an excessive amount of the film 234 may remain above the top surface of the trench 232, impeding the formation of the semiconductor layer during a subsequently applied annealing process (e.g., operation 112 to be described below). In some embodiments, the spacer material layer 222 is removed following the cleaning process at operation 108.

Subsequently, at operation 112, the method 100 (FIG. 1A) applies a first annealing process to the remaining portion of the film 234. In an exemplary embodiment, operation 112 is implemented at a temperature of about 900 degrees Celsius to about 1050 degrees Celsius for from about 1 second to 2 seconds. In many embodiments, referring to FIGS. 9A and 9B, operation 112 causes the first element 240 to react with composition of the fin 210 in the trench 232 to form a first layer 260. In many embodiments, the first annealing process is implemented at a temperature within the range described above such that sufficient thermal energy is supplied to activate the dopant species (e.g., the first element 240) and/or to repair the crystalline structure of the first layer 260. However, if the temperature is too high or the annealing time is too long (i.e., longer than about 2 seconds), the resulting electrical property of the first layer 260 may be compromised.

In many embodiments, the first layer 260 includes an epitaxial semiconductor material doped with the first element (i.e., dopant species) 240. The epitaxial semiconductor material may be any suitable material including a single element semiconductor material such as silicon (Si) or germanium (Ge); a compound semiconductor material, such as gallium arsenide (GaAs), aluminum gallium arsenide (AlGaAs); or a semiconductor alloy, such as silicon germanium (SiGe), gallium arsenide phosphide (GaAsP). In an exemplary embodiment, the first element 240 is arsenic and the epitaxial semiconductor material is silicon. In another exemplary embodiment, the first element 240 is carbon and the epitaxial semiconductor material is silicon germanium.

In an alternative embodiment, the first layer 260 is formed directly over the trenches 232 of the fin 210 by epitaxially growing a semiconductor material (e.g., silicon, silicon germanium, etc.) while introducing the first element 240 in situ. In one such example, a selective epitaxial growth (SEG) process is performed to grow the first layer 260, during which the first element 240 may be introduced by adding dopant species to a source material of the SEG process. The SEG process can be implemented with CVD techniques (e.g., vapor-phase epitaxy (VPE), ultra-high vacuum CVD (UHV-CVD), low-pressure CVD (LP-CVD), and/or PE-CVD), molecular beam epitaxy, other suitable SEG processes, or combinations thereof. The SEG process may use gaseous precursors (e.g., silicon-containing gases, such as $SiH_4$ and/or germanium-containing gases, such as $GeH_4$) and/or liquid precursors, which interact with a composition of the fin 210 to form the first layer 260. Any suitable process (e.g., an in-situ doping process, an ion implantation process, a diffusion process, or combinations thereof) can be implemented for introducing the first element 240 into the first layer 260 during the SEG process. In yet another alternative embodiment, the first layer 260 is directly formed by a suitable deposition process such as ALD. Following the epitaxial growth and doping process, one or more annealing processes may be performed to activate the first element 240 in the first layer 260. The annealing processes may include rapid thermal annealing (RTA), laser annealing processes, and/or other suitable annealing processes.

Figures 10A, 10B:
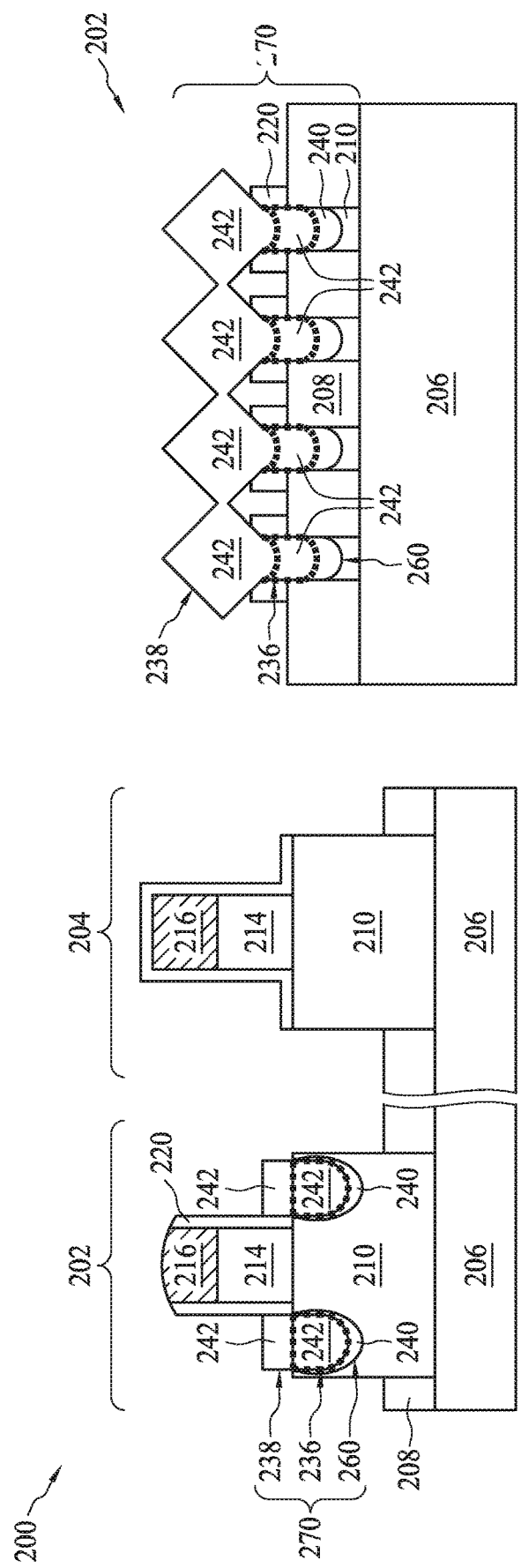

Referring to FIGS. 10A and 10B, at operations 114 and 116, the method 100 (FIG. 1B) forms a second layer 236 over the first layer 260 and a third layer 238 over the second layer 236. In many embodiments, the second layer 236 and the third layer 238 each comprises an epitaxially grown semiconductor material doped with a second element (i.e., dopant species) 242. It is understood that the second layer 236 and the third layer 238 may comprise the same epitaxially grown semiconductor material but may include different concentration of the second element 242. For example, the concentration of the second element 242 in the second layer 236 may be greater than that of the third layer 238. The epitaxially grown semiconductor material of the second layer 236 and the third layer 238 may be any suitable material including a single element semiconductor material such as silicon (Si) or germanium (Ge); a compound semiconductor material, such as gallium arsenide (GaAs), aluminum gallium arsenide (AlGaAs); or a semiconductor alloy, such as silicon germanium (SiGe), gallium arsenide phosphide (GaAsP). The second element 242 may be any suitable element including phosphorus, boron, arsenic, carbon, germanium, indium, other suitable elements, and/or combinations thereof.

In the depicted embodiment, the first layer 260, the second layer 236, and the third layer 238 comprise the same epitaxially grown semiconductor material. In one such example, the first layer 260, the second layer 236, and the third layer 238 all comprise silicon. In another such example, the first layer 260, the second layer 236, and the third layer 238 all comprise silicon germanium. In many embodiments, however, the first element 240 is distinct from and has a higher atomic weight (i.e., a higher atomic number) than the second element 242. For embodiments in which the epitaxially grown material is silicon, the first element 240 is arsenic and the second element 242 is phosphorous. For embodiments in which the epitaxially grown material is silicon germanium, the first element 240 is carbon and the second element 242 is boron.

Methods of forming the second layer 236 and the third layer 238 may be similar to those discussed above with respect to forming the first layer 260. In one example, the second layer 236 and the third layer 238 may each be formed by a plasma deposition process (e.g., operation 108) implemented using a gaseous mixture including a precursor material for the second element 242, followed by a cleaning process (e.g., operation 110) and an annealing process (e.g., operation 112). In another example, the second layer 236 and the third layer 238 may each be formed by expitaxially growing a semiconductor material using a deposition process such as SEG and in-situ doping of the second element 242 during the epitaxial growth, followed by one or more annealing processes (e.g., RTA, laser annealing, etc.).

Figure 11B:
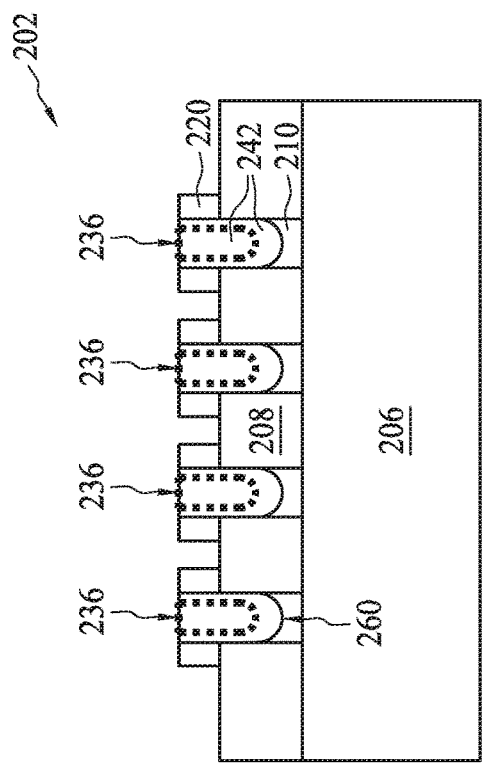
Figure 11A:
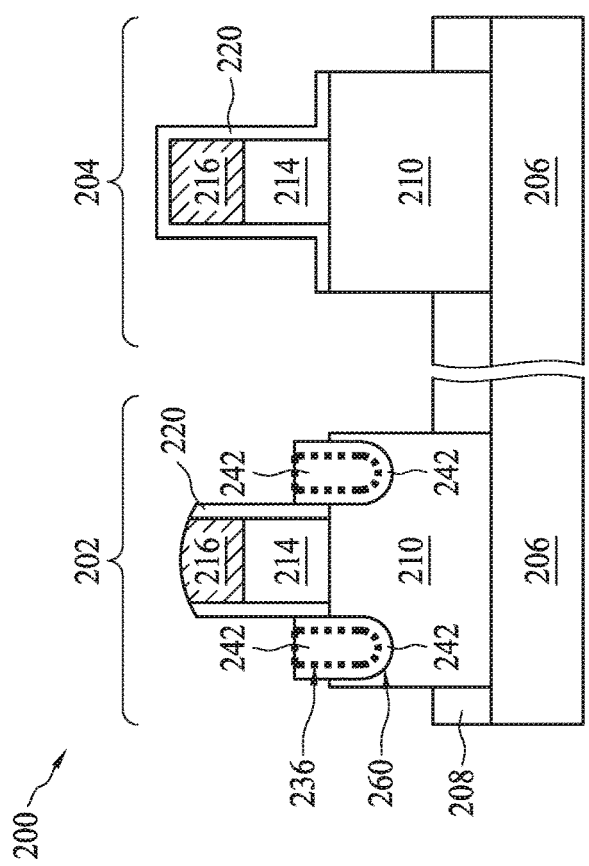

Alternative to operations 108, 110, 112, 114, and 116, the method 100 may implement operations 118, 120, 122, and 124 as illustrated in FIGS. 1A and 1B. At operations 118 and 120, the method 100 (FIG. 1A) forms the first layer 260 in the trenches 232 and subsequently forms the second layer 236 over the first layer 260 (FIGS. 11A and 11B). In the depicted embodiment, each of the first layer 260 and the second layer 236 includes an epitaxially grown semiconductor material doped with the second element (i.e., dopant species) 242. The epitaxially grown semiconductor material of the first layer 260 and the second layer 236 may be similar to the materials discussed above and may a single element semiconductor material such as silicon (Si) or germanium (Ge); a compound semiconductor material, such as gallium arsenide (GaAs), aluminum gallium arsenide (AlGaAs); or a semiconductor alloy, such as silicon germanium (SiGe), gallium arsenide phosphide (GaAsP). In many embodiments, the first layer 260 and the second layer 236 comprise the same epitaxially grown semiconductor material; however, a concentration of the second element 242 differs between the two semiconductor layers. In one example, the concentration of the second element 242 in the second layer 236 is higher than that of the first layer 260. The second element 242 has been discussed in detail above and may be any suitable element including phosphorus, boron, arsenic, carbon, germanium, indium, other suitable elements, and/or combinations thereof. In one exemplary embodiment, the epitaxially grown semiconductor material is silicon and the second element 242 is phosphorous. In another exemplary embodiment, the epitaxially grown semiconductor material is silicon germanium and the second element 242 is boron.

The first layer 260 and the second layer 236 may be formed using any suitable method as discussed above. In an exemplary embodiment, the first layer 260 and the second layer 236 are each formed by epitaxially growing a semiconductor material and introducing in situ the second element 242 during the epitaxial growth process. In one such example, an SEG process is performed to grow the first layer 260 and the second layer 236, during which the second element 242 may be introduced by adding dopant species to a source material of the SEG process. The SEG process can be implemented with CVD deposition techniques (e.g., vapor-phase epitaxy (VPE), ultra-high vacuum CVD (UHV-CVD), low-pressure CVD (LP-CVD), and/or PE-CVD), molecular beam epitaxy, other suitable SEG processes, or combinations thereof. The SEG process may use gaseous precursors (e.g., silicon-containing gases, such as $SiH_4$ and/or germanium-containing gases, such as $GeH_4$) and/or liquid precursors, which interact with a composition of the trenches 232 of the fin 210 to form the first layer 260 and in a subsequent process, to form the second layer 236 over the first layer 260. Any suitable process (e.g., an in-situ doping process, an ion implantation process, a diffusion process, or combinations thereof) can be implemented for introducing the second element 242 into the epitaxial growth process. In yet another alternative embodiment, the first layer 260 and the second layer 236 are each formed by a suitable deposition process such as ALD. Following the epitaxial growth and doping process, one or more annealing processes may be performed to activate the second element 242 in the semiconductor layers. The annealing processes may include rapid thermal annealing (RTA), laser annealing processes, and/or other suitable annealing processes.

Figure 12B:
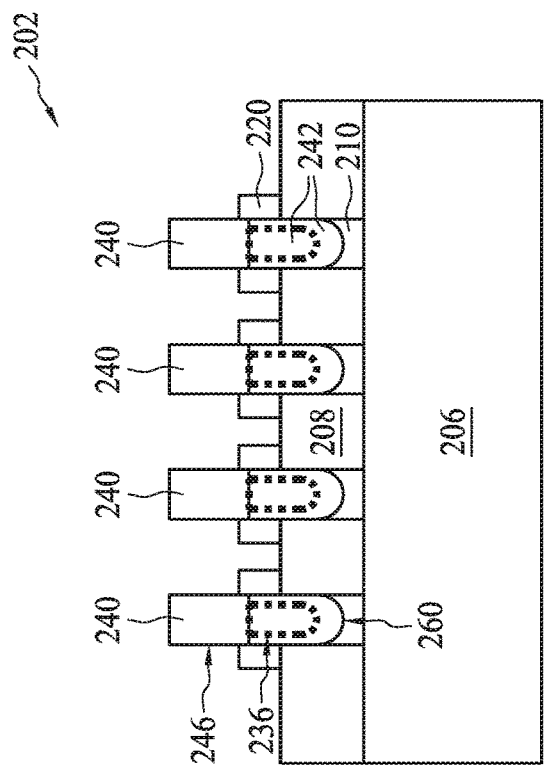
Figure 12A:
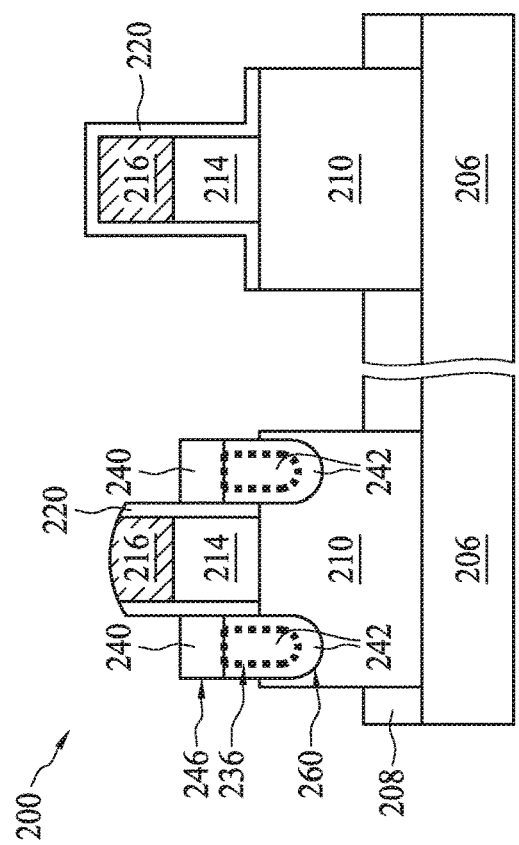

At operation 122, the method 100 (FIG. 1B) deposits a film 246 over a top surface of the second layer 236 (FIGS. 12A and 12B). In many embodiments, the film 246 is uniform in composition and comprises the first element 240. The first element 240 has been discussed in detail above and may include arsenic, carbon, phosphorus, boron, germanium, indium, other suitable elements, and/or combinations thereof. In one exemplary embodiment, the first element 240 is arsenic. In another exemplary embodiment, the first element 240 is carbon.

In the depicted embodiment, the film 246 is formed by a plasma deposition process which has been discussed in detail above. Briefly, the plasma deposition process implements a gaseous mixture comprising a precursor gas of the first element 240 and one or more carrier gases over the top surface of the second layer 236. For embodiments in which the first element 240 is arsenic, the precursor gas may be $AsH_3$, and the carrier gases may include hydrogen helium, argon, and/or xenon. In many embodiments, the concentration of $AsH_3$ in the gaseous mixture may be less than about 10%. In the depicted embodiment, the plasma deposition process is implemented with a bias voltage of about 2 kV, a RF power of about 500 W to about 1500 W, a dosage of the precursor gas of about $1 \times 10^{16}$ to about $4 \times 10^{21}$, a flow rate of about 90 scm to about 150 scm or of about 5 mTorr to about 100 mTorr, and a duration of deposition is less than about 150 ms.

Following the plasma deposition process, referring to FIGS. 13A and 13B, the method 100 (FIG. 1B) implements operation 124 during which a top portion 262 of the film 246 is removed by a cleaning process similar to operation 110 discussed above. In the depicted embodiment, operation 124 is implemented by applying a cleaning solvent 256 (e.g., SPM) at an elevated temperature of about 150 degrees Celsius to about 180 degrees Celsius for about 30 seconds to about 60 seconds.

Subsequently, at operation 126, the method 100 (FIG. 1B) applies a second annealing process, which may be implemented at a temperature from about 1000 degrees Celsius to about 1200 degrees Celsius for less than about 10 ms (milliseconds). The second annealing process aims to activate the first element 240 (i.e., a dopant species) formed in or over the top surface of the second layer 236 in order to boost device performance. On one hand, if the temperature of the second annealing process is higher than about 1200 degrees Celsius, then a dopant profile of the first element 240 may be altered by excessive heat. On the other hand, if the temperature of the second annealing process is lower than about 1000 degrees Celsius, then the first element 240 may not be sufficiently activated to achieve desired device performance. The rapid annealing time enables a desirable amount of heat to activate the first element 240 while minimizing thermal budget of the underlying second layer 236. In some embodiments, referring to FIGS. 10A and 10B, operation 126 is implemented to activate the dopant species (e.g., the second element 242) present in the source/drain features of the FinFET device 200. In some embodiments, referring to FIGS. 14A and 14B, operation 126 causes the first element 240 to react with composition of the second layer 236 to form the third layer 238.

In many embodiments, the third layer 238 includes an epitaxial semiconductor material doped with the first element (i.e., dopant species) 240. The epitaxial semiconductor material in the third layer 238 may be any suitable material including a single element semiconductor material such as silicon (Si) or germanium (Ge); a compound semiconductor material, such as gallium arsenide (GaAs), aluminum gallium arsenide (AlGaAs); or a semiconductor alloy, such as silicon germanium (SiGe), gallium arsenide phosphide (GaAsP). In the depicted embodiment, the epitaxial semiconductor material in the third layer 238 is the same as that of the first layer 260 and the second layer 236; however, the first layer 260 and the second layer 236 both comprise the second element (i.e., dopant species) 242, whereas the third layer 238 comprises the first element 240. In an exemplary embodiment, the first element 240 and the second element 242, as discussed above, are distinct elements and the first element 240 has a greater atomic weight (i.e., atomic number) than the second element 242. In one such example, the first element 240 is arsenic, the second element 242 is phosphorous, and the epitaxial semiconductor material is silicon. In another such example, the first element 240 is carbon, the second element 242 is boron, and the epitaxial semiconductor material is silicon germanium.

In an alternative embodiment, the third layer 238 is formed directly over the top surface of the second layer 236 by epitaxially growing a semiconductor material (e.g., silicon, silicon germanium, etc.) while introducing the first element 240 in situ. In one such example, an SEG process is performed to grow the third layer 238, during which the first element 240 is introduced as discussed in detail above. Any suitable process (e.g., an in-situ doping process, an ion implantation process, a diffusion process, or combinations thereof) can be implemented for introducing the first element 240 into the third layer 238. In yet another alternative embodiment, the third layer 238 is formed by a suitable deposition process such as ALD. Following the epitaxial growth and doping process, one or more annealing processes may be performed to activate the first element 240 in the third layer 238. The annealing processes may include rapid thermal annealing (RTA), laser annealing processes, and/or other suitable annealing processes.

Figure 15A:
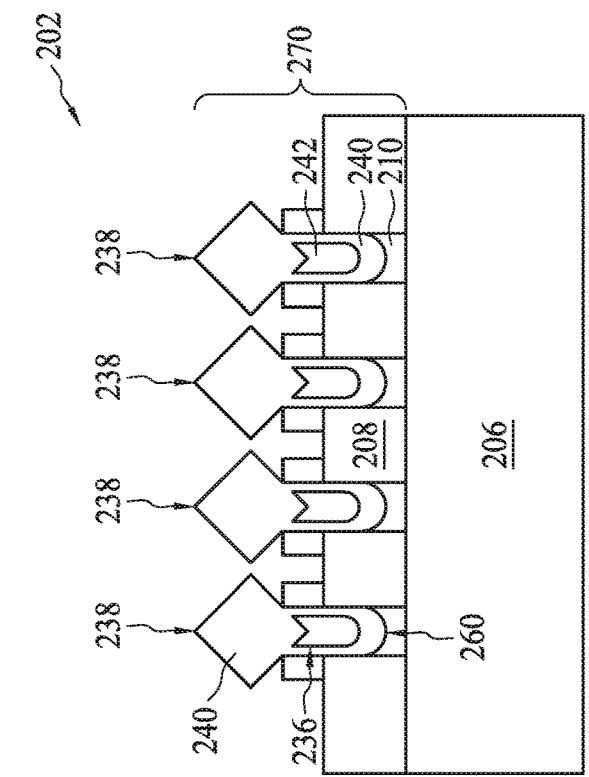
Figure 15B:
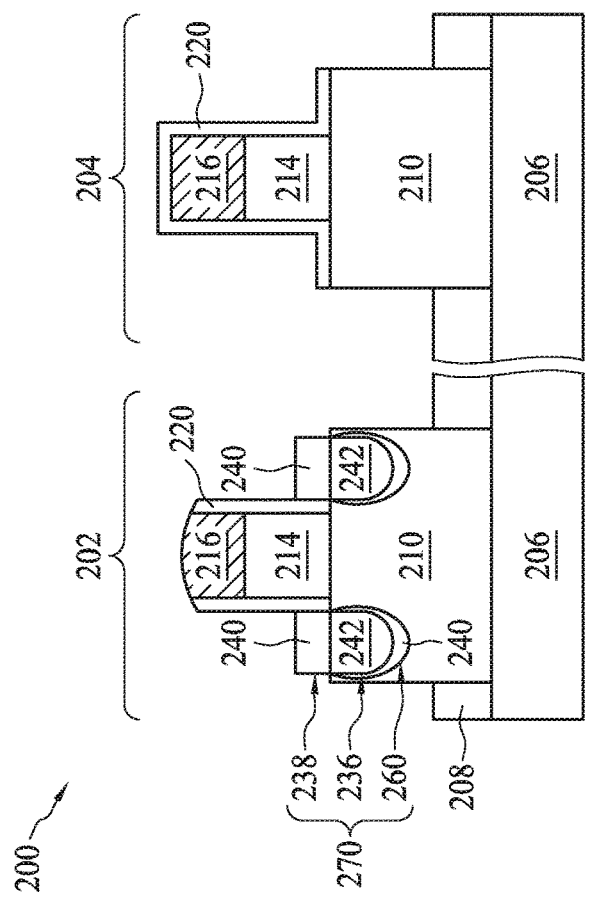

As illustrated in FIGS. 15A and 15B, the method 100 may provide yet another embodiment comprising a first layer 260 that includes an epitaxial semiconductor material doped with the first element 240 formed in the trenches 232 of the fin 210, a second layer 236 formed over the first layer 260 that includes an epitaxial semiconductor material the same as the first layer 260 but is doped with the second element 242, and a third layer 238 that includes the same epitaxial semiconductor material as the first layer 260 and is doped with the first element 240. In one example, the epitaxial semiconductor material may be silicon, the first element 240 may be arsenic, and the second element 242 may be phosphorous. In another example, the epitaxial semiconductor material may be silicon germanium, the first element 240 may be carbon, and the second element 242 may be boron. The first layer 260, the second layer 236, and the third layer 238 may each be formed using any of the methods discussed above. In particular, the first layer 260 and the third layer 238 may each be formed using a plasma deposition process (e.g., operations 108 and 122), followed by a cleaning process (e.g., operations 110 and 124) and a subsequent annealing process (e.g., operations 112 and 126) as detailed above.

In an exemplary embodiment, referring to FIG. 16A, which depicts a portion of FIG. 10A, the method 100 forms a source/drain feature 270 that includes a first layer 260 (i.e., a lower layer 260), a second layer 236 (i.e., a middle layer 236), and a third layer 238 (i.e., an upper layer 238). Of which, the first layer 260 includes an epitaxially grown semiconductor material doped with a first element (i.e., dopant species) 240, and each of the second layer 236 and the third layer 238 includes the same epitaxially grown semiconductor material doped with a second element (i.e., dopant species) 242 that is different from the first element 240. As provided herein, the first element 240 has a higher atomic weight (i.e., higher atomic number) than the second element 242. Specifically, the epitaxially grown semiconductor material may be silicon, the first element 240 may be arsenic, and the second element 242 may be phosphorous. Alternatively, the epitaxially grown semiconductor material may be silicon germanium, the first element 240 may be carbon, and the second element 242 may be boron. In the depicted embodiment, the second layer 236 is embedded within the first layer 260 such that the second layer 236 is physically separated from the fin 210 by a distance 266. In many embodiments, the second element 242 diffuses out of the second layer 236 following a thermal annealing process such as operation 126. Loss of the second element 242 into other components of the FinFET device 200 may lead to increased device resistance in the source/drain region as well as short-channel effects such as DIBL as discussed above. When the first layer 260 includes a different dopant species (i.e., the first element 240), the second element 242 in the second layer 236 is inhibited from diffusing out of the source/drain feature 270. Therefore, in many embodiments, a diffusion distance of the second element 242 enabled by operation 126 (i.e., the second annealing process) is shortened by a distance 266, which is a thickness of the first layer 260 as shown in FIG. 16A. In one such example, the distance 266 is about 2 nm (nanometers) to about 10 nm. On one hand, if the distance 266 is less than about 2 nm, a poor distribution of the dopant species is resulted and could degrade a performance of the source/drain feature 270. On the other hand, if the distance 266 is more than about 10 nm, a high risk for current leakage, i.e., short channel effect, is prevalent.

In another exemplary embodiment, referring to FIG. 16B, which depicts a portion of FIG. 14A, the method 100 forms a source/drain feature 270 that includes a first layer 260, a second layer 236, and a third layer 238. Each of the first layer 260 and the second layer 236 includes an epitaxially grown semiconductor material doped with the second element (i.e., dopant species) 242, and the third layer 238 includes the same epitaxially grown semiconductor material doped with the first element (i.e., dopant species) 240. Similar to the embodiment depicted in FIG. 16A, the epitaxially grown semiconductor material may be silicon, the first element 240 may be arsenic, and the second element 242 may be phosphorous. Alternatively, the epitaxially grown semiconductor material may be silicon germanium, the first element 240 may be carbon, and the second element 242 may be boron. In the current example, the third layer 238, due to the inclusion of the first dopant 240, acts as a barrier that prevents the second element 242 from diffusing upward and out of the source/drain feature 270.

Subsequently, at operation 128, the method 100 (FIG. 1B) performs additional fabrication steps to the FinFET device 200. Referring to FIGS. 17A and 17B, operation 128 may include replacing the dummy gate structure 212 with a high-k metal gate structure in a gate replacement process, which includes forming a high-k gate dielectric layer (not shown) over the fin 210 and forming a metal gate electrode 218 over the high-k gate dielectric layer. The high-k metal gate structure may include additional layers such as, for example, capping layers, interfacial layers, diffusion layers, barrier layers, hard mask layers, or combinations thereof.

The metal gate electrode 218 may comprise a plurality of metal layers (e.g., bulk conductive layers, work function layers, etc.). In some embodiments, replacing the dummy gate structure 212 includes a number of processes. For example, the gate replacement process may include depositing a contact etch-stop layer CESL 250 over the source/drain features 270, depositing and planarizing an ILD layer 252 surrounding the source/drain features 270 and the dummy gate structure 212, removing the dummy gate electrode 214 to form a trench (not shown) via a series of patterning and etching processes, and forming the high-k metal gate structure in the trench. Additionally, metal contact features 254 may also be formed over the source/drain features 270 via a series of patterning, etching, and deposition processes.

The FinFET device 200 formed in accordance with various embodiments provided herein may be included in a microprocessor, a memory, and/or other integrated circuit device. In some embodiments, the FinFET device 200 may be a portion of an IC chip, a system on chip (SoC), or portion thereof, that includes various passive and active microelectronic devices such as resistors, capacitors, inductors, diodes, metal-oxide semiconductor field effect transistors (MOSFET), complementary metal-oxide semiconductor (CMOS) transistors, bipolar junction transistors (BJTs), laterally diffused MOS (LDMOS) transistors, high voltage transistors, high frequency transistors, other suitable components, or combinations thereof. Additional features can be added to the FinFET device 200 by subsequent processing steps. For example, various vertical interconnect features such as contacts and/or vias, and/or horizontal interconnect features such as lines, and multilayer interconnect features such as metal layers and interlayer dielectrics can be formed over the substrate 206, configured to connect the various features or structures of the FinFET 200. The various interconnect features may implement various conductive materials including aluminum, aluminum alloy (e.g., aluminum/silicon/copper alloy), copper, copper alloy, titanium, titanium nitride, tantalum, tantalum nitride, tungsten, polysilicon, metal silicides, other suitable metals, or combinations thereof. The metal silicides may include nickel silicide, cobalt silicide, tungsten silicide, tantalum silicide, titanium silicide, platinum silicide, erbium silicide, palladium silicide, or combinations thereof.

Although not intended to be limiting, one or more embodiments of the present disclosure offer improvements for semiconductor devices and methods of fabricating the same. For example, embodiments of the present disclosure provide methods of reducing diffusion of a primary dopant species out of source/drain features in a FinFET device by introducing a secondary dopant species in at least one portion of the source/drain features. Specifically, by implementing a plasma deposition process, a semiconductor layer including the secondary dopant species can be formed as a diffusion barrier layer that separates the semiconductor layers doped with the primary dopant species from surrounding components of the device (e.g., the fin, the gate, etc.). As a result, embodiments of the present disclosure ensure that a desirable concentration of primary dopant species may be maintained within the source/drain features and potential short-channel effects may be minimized in the FinFET device.

Accordingly, the present disclosure provides many different embodiments of metal gates in semiconductor devices and methods of fabricating the same. In one aspect, the present disclosure provides a device that includes a fin over a substrate, a gate structure over the fin, and an epitaxial source/drain feature over the fin and adjacent to the gate structure. In some embodiments, the epitaxial source/drain feature includes a first layer, a second layer over the first layer, and a third layer over the second layer, wherein the second layer is doped with a first dopant, and wherein at least one of the first layer and the third layer is doped with a second dopant different from the first dopant. In some embodiments, both the first layer and the third layer are doped with the second dopant.

In some embodiments, the first layer is doped with the second dopant and physically separates the second layer from the fin. In other embodiments, a separation distance between the second layer and the fin is between about 2 nanometers and about 10 nanometers. In further embodiments, a diffusion distance of the first dopant in the second layer is less than the separation distance.

In some embodiments, the second dopant has a greater atomic weight than the first dopant. In further embodiments, the first dopant is phosphorous and the second dopant is arsenic.

In another aspect, the present disclosure provides a method that includes forming a fin over a substrate, forming a gate structure over the fin, removing a portion of the fin adjacent to the gate structure to form a recess (i.e., a trench), forming a source/drain feature in the recess, and performing a second annealing process to the source/drain feature. In some embodiments, forming the source/drain feature includes depositing a film including a first element in the recess, wherein the first element in a bottom portion of the film diffuses into a top surface of the recess, substantially removing a top portion of the film, performing a first annealing process to the bottom portion of the film to form a first epitaxial layer, forming a second epitaxial layer over the first epitaxial layer, and forming a third epitaxial layer over the second epitaxial layer. In some embodiments, the second epitaxial layer and the third epitaxial layer include a second element different from the first element.

In some embodiments, removing the top portion of the film includes exposing the film to a mixture of sulfuric acid and hydrogen peroxide at a temperature between about 150 degrees Celsius and about 180 degrees Celsius for a duration between about 30 seconds and about 65 seconds.

In some embodiments, performing the first annealing process is implemented at a temperature between about 900 degrees Celsius and about 1000 degrees Celsius for a duration between about 1 second and about 2 seconds.

In some embodiments, performing the second annealing process is implemented at a temperature between about 1000 degrees Celsius and about 1200 degrees Celsius for a duration of less than about 10 millisecond.

In some embodiments, depositing the film includes exposing the top surface of the recess with a dose of plasma including the first element and a carrier gas, the carrier gas having hydrogen, helium, or combination thereof. In further embodiments, the first element is arsenic and the second element is phosphorous. In some embodiments, the first element is boron and the second element is carbon.

In another aspect, the present disclosure provides a method that includes providing a semiconductor device that includes a fin formed over a substrate and a gate structure formed over the fin, forming a recess having a first surface in the fin adjacent to the gate structure, and forming a source/drain feature in the recess. In some embodiments, forming the source/drain feature includes forming a first epitaxial layer in the recess, forming a second epitaxial layer over the first epitaxial layer, and forming a third epitaxial layer over the second epitaxial layer. In some embodiments, the second epitaxial layer is doped with a first element. In further embodiments, one or both of the forming of the first epitaxial layer and the forming of the third epitaxial layer includes depositing a film including a second element different from the first element such that the second element in a bottom portion of the film diffuses into one or both of the first surface of the recess and a top surface of the second epitaxial layer to form the first epitaxial layer and the third epitaxial layer, respectively.

In some embodiments, depositing the film includes performing a plasma deposition process. In further embodiments, depositing the film includes implementing a dose of plasma including the second element and a carrier gas, the carrier gas having hydrogen, helium, or combination thereof. In other embodiments, depositing the film includes performing an atomic-layer deposition process.

In some embodiments, one or both of the forming of the first epitaxial layer and the forming of the third epitaxial layer further includes substantially removing a top portion of the film, and performing a first annealing process to the film at a temperature between about 900 degrees Celsius and about 1000 degrees Celsius for a duration between about 1 second and about 2 seconds. In some embodiments, removing the top portion includes exposing the film to a mixture of sulfuric acid and hydrogen peroxide at a temperature between about 150 degrees Celsius and about 180 degrees Celsius for a duration between about 30 seconds and about 65 seconds.

In some embodiments, one or both of the forming of the first epitaxial layer and the forming of the third epitaxial layer further includes, subsequent to the performing of the first annealing process, performing a second annealing process, wherein the second annealing process is implemented at a temperature between about 1000 degrees Celsius and about 1200 degrees Celsius for a duration of less than about 10 millisecond.

In yet another aspect, the present disclosure provides a method that includes forming a fin over a substrate, forming a gate structure over the fin, removing a portion of the fin adjacent to the gate structure to form a recess, and forming a source/drain feature in the recess. In some embodiments, forming the source/drain feature includes, forming a first epitaxial layer in the recess, forming a second epitaxial layer over the first epitaxial layer, forming a third epitaxial layer over the second epitaxial layer, and doping each of the first epitaxial layer, the second epitaxial layer, and the third epitaxial layer with a first dopant species or a second dopant species different from the first dopant species, such that the second epitaxial layer includes the first dopant species and at least one of the first epitaxial layer and the third epitaxial layer comprises the second dopant species.

In some embodiments, the doping is implemented simultaneously to forming the first epitaxial layer, the second epitaxial layer, and the third epitaxial layer. In some embodiments, both the first epitaxial layer and the third epitaxial layer are doped with the second dopant species. In some embodiments, the first epitaxial layer is doped with the second dopant species and the third epitaxial layer is doped with the first dopant species. In further embodiments, the method further includes doping the first epitaxial layer with the first dopant species and doping the third epitaxial layer with the second dopant species.

In some embodiments, the first dopant species is phosphorous and the second dopant species is arsenic. In some embodiments, the first dopant species is boron and the second dopant species is carbon.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a fin extending lengthwise along a first direction over a substrate;
    a gate structure extending lengthwise along a second direction perpendicular to the first direction over the fin;
    gate spacers adjacent the gate structure;
    an epitaxial source/drain feature over the fin and adjacent to the gate structure, wherein the epitaxial source/drain feature includes a first layer, a second layer over and contacting the first layer, and a third layer over and contacting the second layer; and
    a source/drain contact over and contacting the third layer, wherein the source/drain contact is separated from the second layer by the third layer,
    wherein the second layer is doped with a first dopant and wherein the first and third layers are doped with a second dopant, and the second dopant has a greater atomic weight than the first dopant,
    wherein the second layer has a greater concentration of the first dopant than in the first and third layers,
    wherein in a cross-sectional view along the second direction, an entirety of outer sidewalls of the second layer is surrounded by and directly contact sidewall portions of the first layer,
    wherein the gate spacers include sidewall portions directly contacting a sidewall portion of the first layer, and the sidewall portion of the first layer separates the second layer from the gate spacers.

2. The semiconductor device of claim 1, wherein the first dopant is phosphorous, and the second dopant is arsenic.

3. The semiconductor device of claim 2, wherein the first, second, and third layers are made of a same single element semiconductor material.

4. The semiconductor device of claim 3, wherein the same single element semiconductor material is silicon.

5. The semiconductor device of claim 1, wherein the first dopant is boron, and the second dopant is carbon.

6. The semiconductor device of claim 5, wherein the first, second, and third layers are made of a same semiconductor alloy material.

7. The semiconductor device of claim 6, wherein the same semiconductor alloy material is silicon germanium.

8. The semiconductor device of claim 6, wherein the third layer is in direct contact with sidewalls of the gate spacers.

9. The semiconductor device of claim 1, further comprising:
    an etch stop layer over the third layer, wherein the source/drain contact penetrates the etch stop layer to land on the third layer, wherein a first sidewall of the third layer directly contacts the gate spacers and a second sidewall of the third layer directly contacts the etch stop layer.

10. A device, comprising:
a fin extending lengthwise along a first direction over a semiconductor substrate;
a gate structure extending lengthwise along a second direction perpendicular to the first direction over the fin;
an epitaxial source/drain feature over the fin and adjacent to the gate structure, wherein the epitaxial source/drain feature includes:
a first carbon-doped silicon germanium layer,
a boron-doped silicon germanium layer, and
a second carbon-doped silicon germanium layer,
wherein the boron-doped silicon germanium layer is sandwiched between and contacts the first and second carbon-doped silicon germanium layers, wherein the second carbon-doped silicon germanium layer is above the first carbon-doped silicon germanium layer;
an etch stop layer disposed on a top and a side surface of the second carbon-doped silicon germanium layer; and
a source/drain contact penetrating through the etch stop layer to land on the top surface of the second carbon-doped silicon germanium layer,
wherein a concentration of boron is greater in the boron-doped silicon germanium layer than in each of the first and second carbon-doped silicon germanium layers,
wherein along the second direction, outer sidewalls of the boron-doped silicon germanium layer are surrounded by and directly contact sidewall portions of the first carbon-doped silicon germanium layer,
wherein along the first direction, a top surface of the boron-doped silicon germanium layer and a bottom surface of the second carbon-doped silicon germanium layer have a same width,
wherein the second carbon-doped silicon germanium layer is in direct contact with gate spacers disposed along sidewalls of the gate structure.

11. The device of claim 10, wherein along the first direction, side surfaces of the boron-doped silicon germanium layer are also surrounded by and directly contact the first carbon-doped silicon germanium layer, and a top surface of the boron-doped silicon germanium layer is covered by the second carbon-doped silicon germanium layer.

12. The device of claim 10, wherein the second carbon-doped silicon germanium layer has a greater width along the second direction than that of the boron-doped silicon germanium layer.

13. The device of claim 10, wherein the second carbon-doped silicon germanium layer directly contacts the first carbon-doped silicon germanium layer.

14. The device of claim 10, wherein the gate spacers are above the fin and in direct contact with a side surface of the second carbon-doped silicon germanium layer and in direct contact with a side surface of the first carbon-doped silicon germanium layer.

15. A semiconductor device, comprising:
a semiconductor fin protruding from a substrate and above a shallow trench isolation (STI), the semiconductor fin extending lengthwise along a first direction;
a metal gate stack disposed over a channel region of the semiconductor fin, the metal gate stack extending lengthwise along a second direction perpendicular to the first direction;
gate spacers adjacent the metal gate stack;
a source/drain feature disposed in the semiconductor fin and adjacent to the metal gate stack, wherein the source/drain feature includes a first epitaxial layer, a second epitaxial layer disposed over the first epitaxial layer, and a third epitaxial layer disposed over and in direct contact with the first epitaxial layer and the second epitaxial layer;
an etch stop layer disposed on a top and a first side surface of the third epitaxial layer, wherein a second side surface of the third epitaxial layer is opposite to the first side surface and contacting the gate spacers; and
a source/drain contact penetrating through the etch stop layer to land on the top surface of the third epitaxial layer,
and further wherein:
the first epitaxial layer, the second epitaxial layer, and the third epitaxial layer include a same semiconductor material,
the first epitaxial layer and the third epitaxial layer both include the same semiconductor material doped with a first dopant,
the second epitaxial layer includes the same semiconductor material doped with a second dopant different from the first dopant and the first dopant has a first atomic weight, the second dopant has a second atomic weight, and the first atomic weight is greater than the second atomic weight,
wherein in a cross-sectional view along the second direction, the first epitaxial layer completely surrounds and contacts bottom and sidewall surfaces of the second epitaxial layer,
wherein along the second direction, the gate spacers include sidewall portions directly contacting the sidewall portions of the first epitaxial layer, and the sidewall portions of the first epitaxial layer separates the second epitaxial layer from the gate spacers.

16. The semiconductor device of claim 15, wherein the same semiconductor material is silicon, the first dopant is arsenic, and the second dopant is phosphorous.

17. The semiconductor device of claim 15, wherein the same semiconductor material is silicon germanium, the first dopant is carbon, and the second dopant is boron.

18. The semiconductor device of claim 15, wherein the same semiconductor material is silicon, germanium, gallium arsenide, or aluminum gallium arsenide, wherein the first dopant and the second dopant are both of n-conductivity type.

19. The semiconductor device of claim 15, wherein the same semiconductor material is silicon germanium or gallium arsenide phosphide, wherein the first dopant and the second dopant are both of p-conductivity type.

20. The semiconductor device of claim 15, wherein the first epitaxial layer physically separates the second epitaxial layer from the semiconductor fin.

* * * * *